United States Patent
Lee

(10) Patent No.: US 10,756,108 B2
(45) Date of Patent: Aug. 25, 2020

(54) VERTICAL MEMORY DEVICES

(71) Applicant: Samsung Electronics Co., Ltd., Suwon-si (KR)

(72) Inventor: Hae-Min Lee, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/266,127

(22) Filed: Feb. 4, 2019

(65) Prior Publication Data
US 2020/0051996 A1    Feb. 13, 2020

(30) Foreign Application Priority Data
Aug. 9, 2018    (KR) .................. 10-2018-0092748

(51) Int. Cl.
| H01L 27/11582 | (2017.01) |
| H01L 27/1157 | (2017.01) |
| H01L 21/311 | (2006.01) |
| H01L 23/535 | (2006.01) |
| H01L 27/11573 | (2017.01) |

(52) U.S. Cl.
CPC .. *H01L 27/11582* (2013.01); *H01L 21/31144* (2013.01); *H01L 23/535* (2013.01); *H01L 27/1157* (2013.01); *H01L 27/11573* (2013.01)

(58) Field of Classification Search
None
See application file for complete search history.

(56) References Cited

U.S. PATENT DOCUMENTS

| 8,476,713 | B2 | 7/2013 | Lee et al. |
| 8,569,826 | B2 | 10/2013 | Kidoh et al. |
| 8,728,889 | B2 * | 5/2014 | Lee ................. H01L 21/76802 438/257 |
| 9,397,115 | B1 | 7/2016 | Nozawa |
| 9,437,483 | B2 | 9/2016 | Lee et al. |

(Continued)

FOREIGN PATENT DOCUMENTS

| KR | 10-2011-0015338 A | 2/2011 |
| KR | 10-2011-0119896 A | 11/2011 |

*Primary Examiner* — Telly D Green
(74) *Attorney, Agent, or Firm* — Muir Patent Law, PLLC

(57) ABSTRACT

A vertical memory device includes a substrate including a first region including a cell array formed thereon and a second region surrounding the first region, the second region including a stair structure formed thereon, gate electrodes stacked on the substrate to be spaced apart from each other in a first direction vertical to an upper surface of the substrate, each of the gate electrodes extending in a second direction parallel to the upper surface of the substrate and including a pad at an end portion thereof in the second direction, a channel extending through the gate electrodes in the first direction on the first region of the substrate, and contact plugs formed on the second region, the contact plugs extending in the first direction to contact the pads of the gate electrodes respectively. A first pad of the pads, in a plan view, may have a convex edge portion that is convex in a direction away from the first region of the substrate, and a second pad disposed on the first pad, in a plan view, may have a concave edge portion that is concave in a direction toward the first region of the substrate.

18 Claims, 37 Drawing Sheets

(56) References Cited

U.S. PATENT DOCUMENTS

| | | | |
|---|---|---|---|
| 9,646,987 B2 | 5/2017 | Watanabe | |
| 9,741,563 B2 | 8/2017 | Xiang et al. | |
| 9,870,941 B2 | 1/2018 | Ha et al. | |
| 10,153,296 B2* | 12/2018 | Iida | H01L 27/1157 |
| 10,204,919 B2* | 2/2019 | Lee | H01L 27/0207 |
| 10,468,433 B2* | 11/2019 | Kim | H01L 27/11582 |
| 10,546,870 B2* | 1/2020 | Shimabukuro | H01L 27/11578 |
| 2012/0164821 A1* | 6/2012 | Kim | H01L 29/40117 438/588 |
| 2017/0069567 A1* | 3/2017 | Chen | H01L 27/11582 |
| 2017/0179025 A1* | 6/2017 | Yun | H01L 27/11565 |
| 2017/0294383 A1* | 10/2017 | Tanzawa | H01L 27/11582 |
| 2017/0323798 A1 | 11/2017 | Kang et al. | |
| 2018/0247955 A1* | 8/2018 | Iida | H01L 27/11582 |

\* cited by examiner

FIG. 1
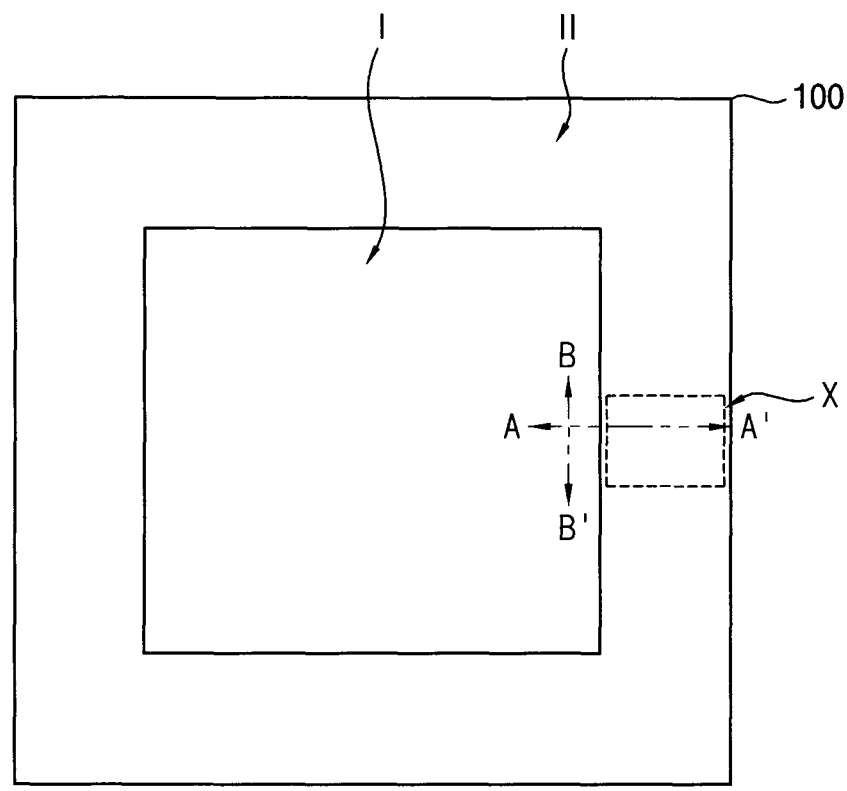
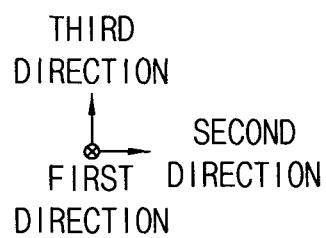

FIG. 4
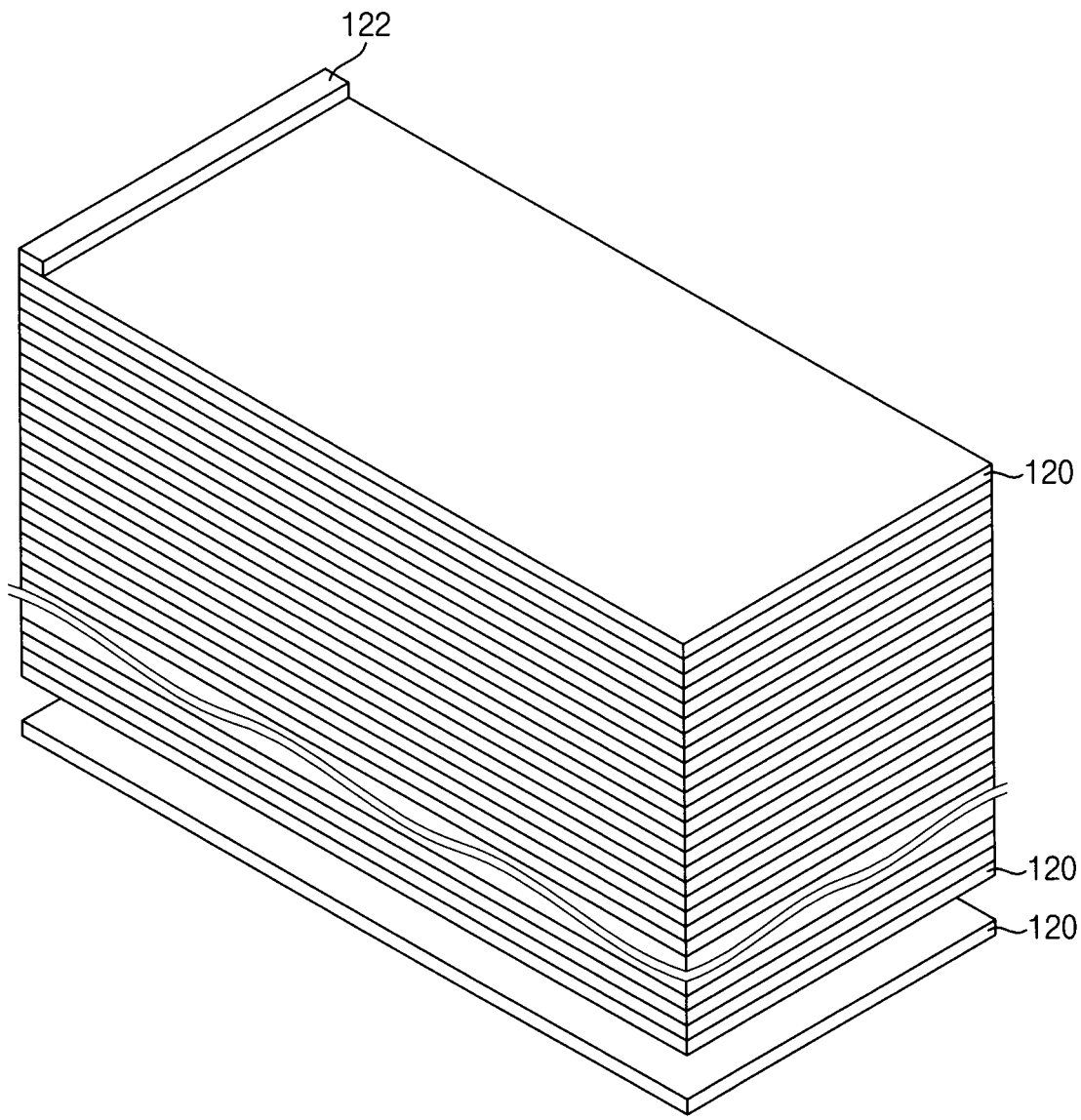
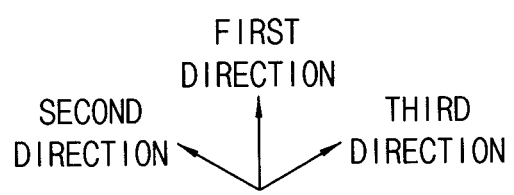

FIG. 5
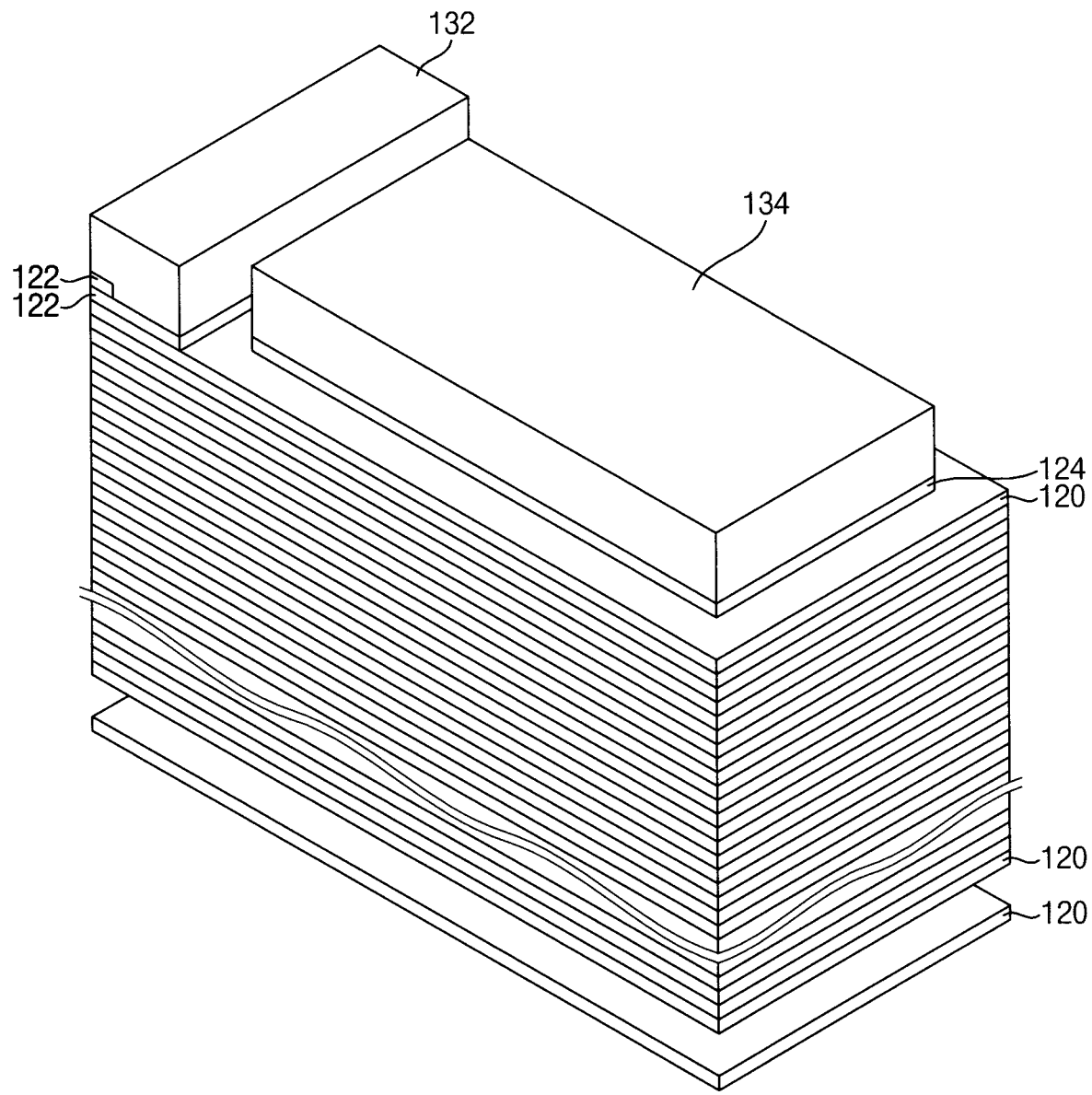
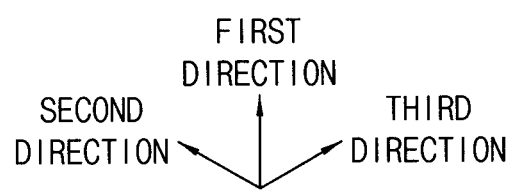

FIG. 8
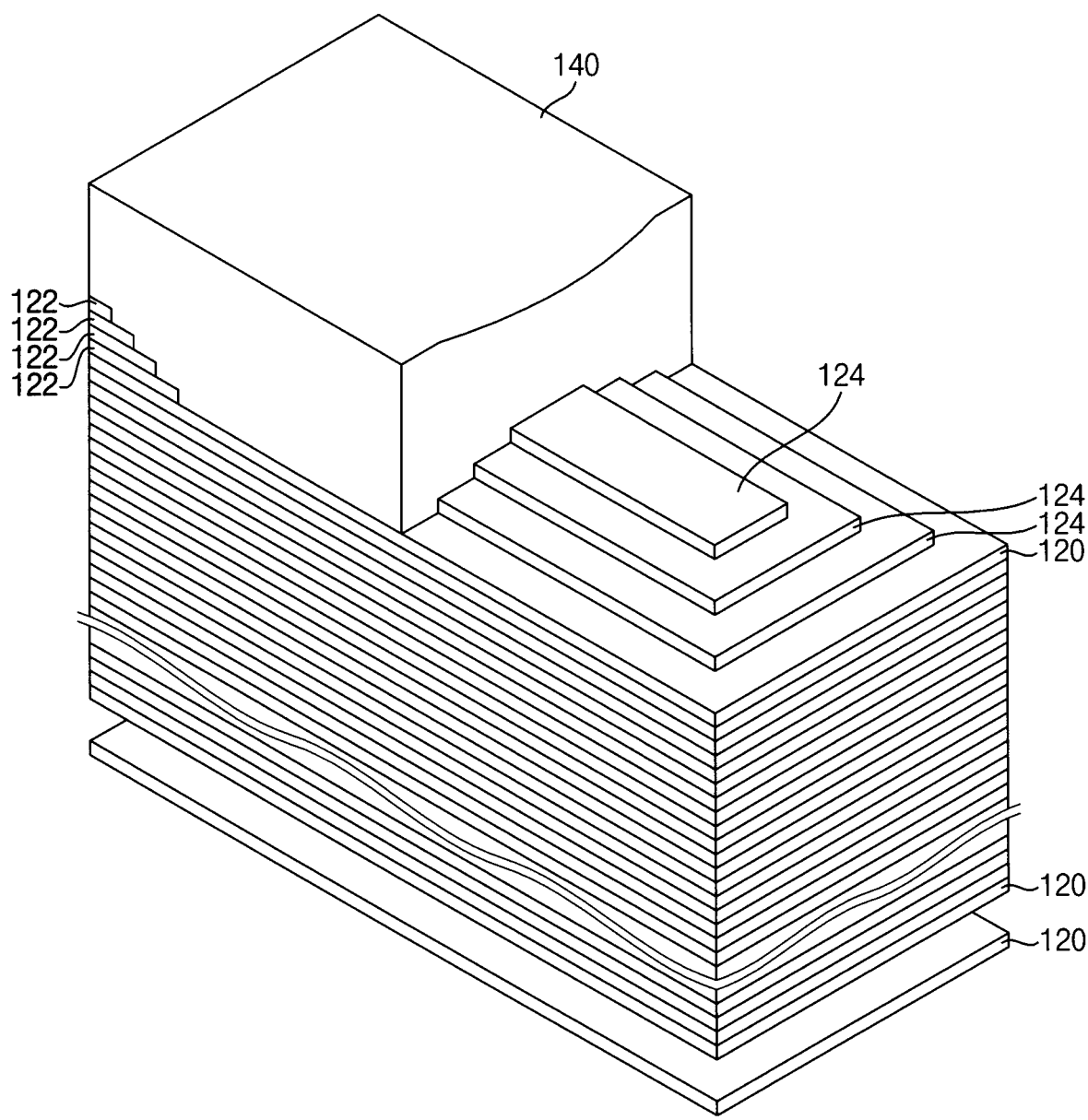
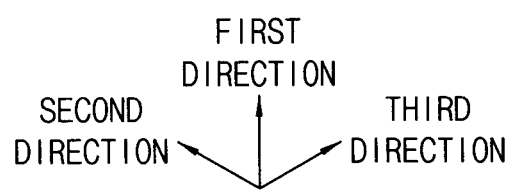

FIG. 9
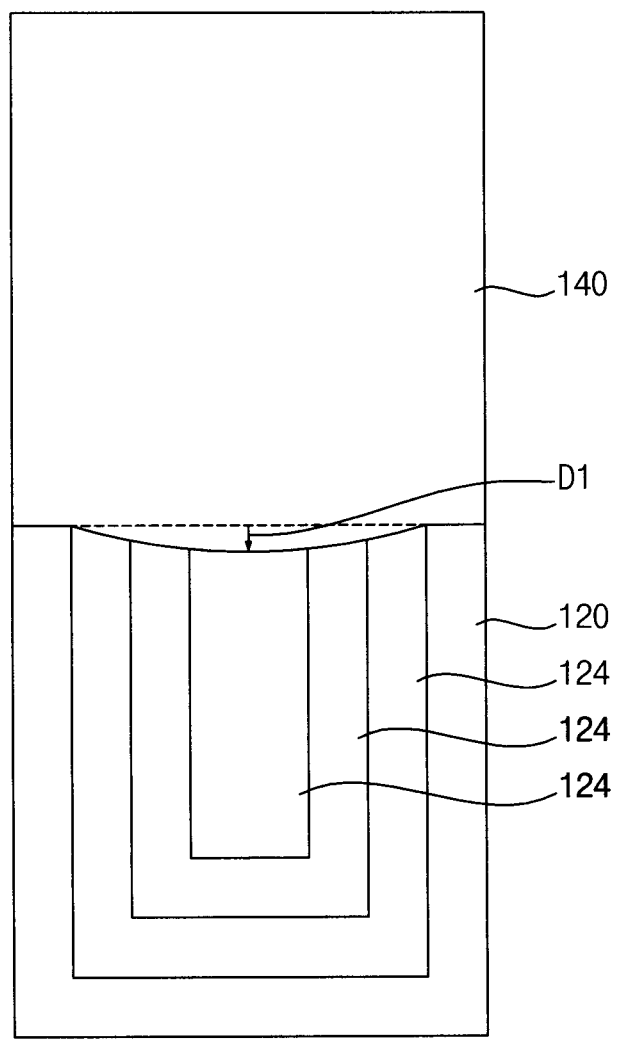
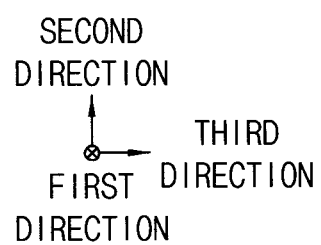

FIG. 12
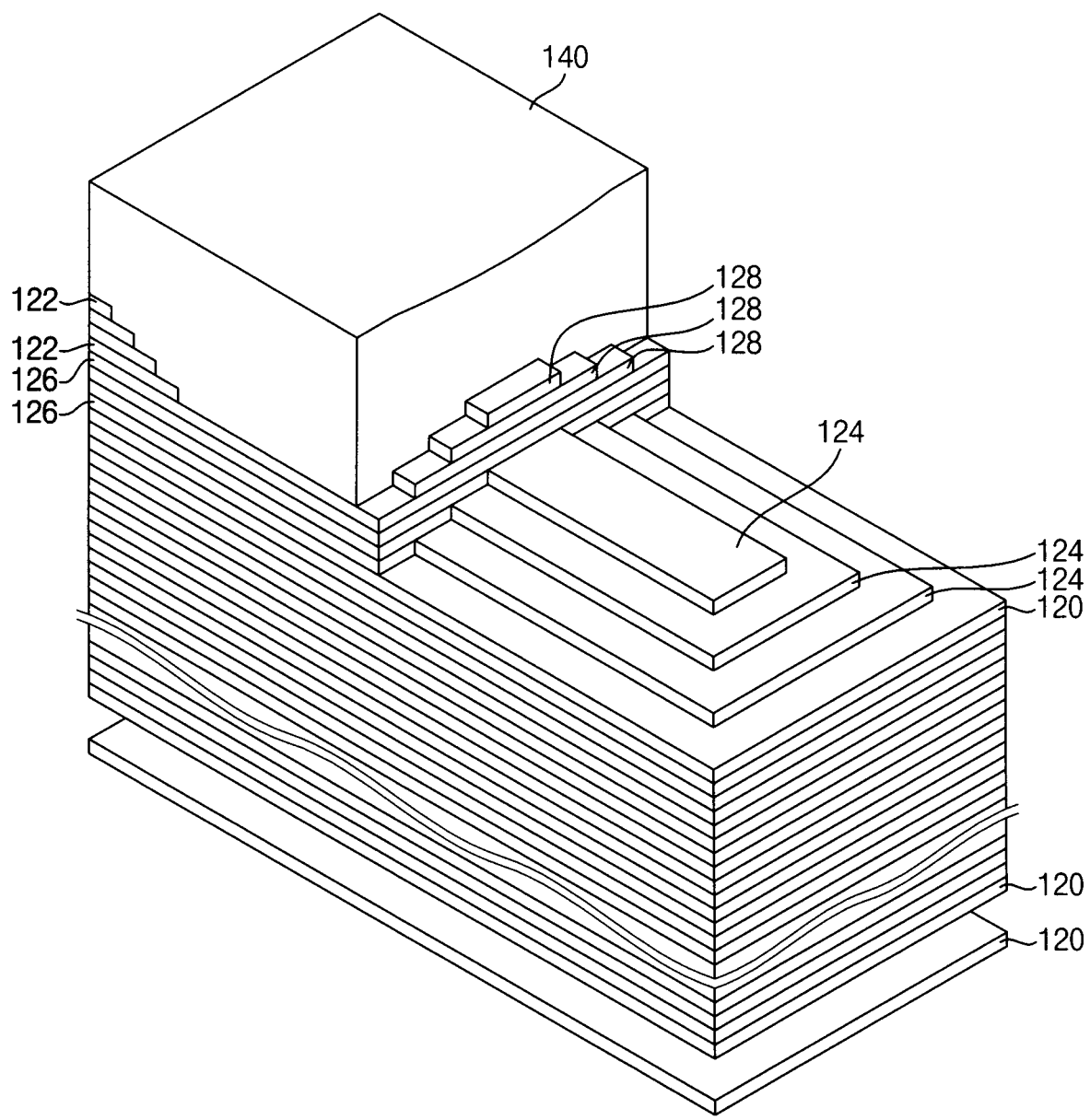
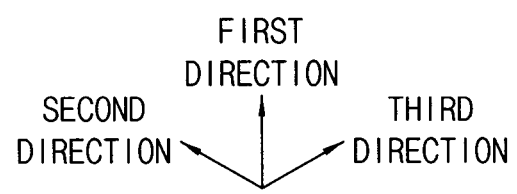

FIG. 14
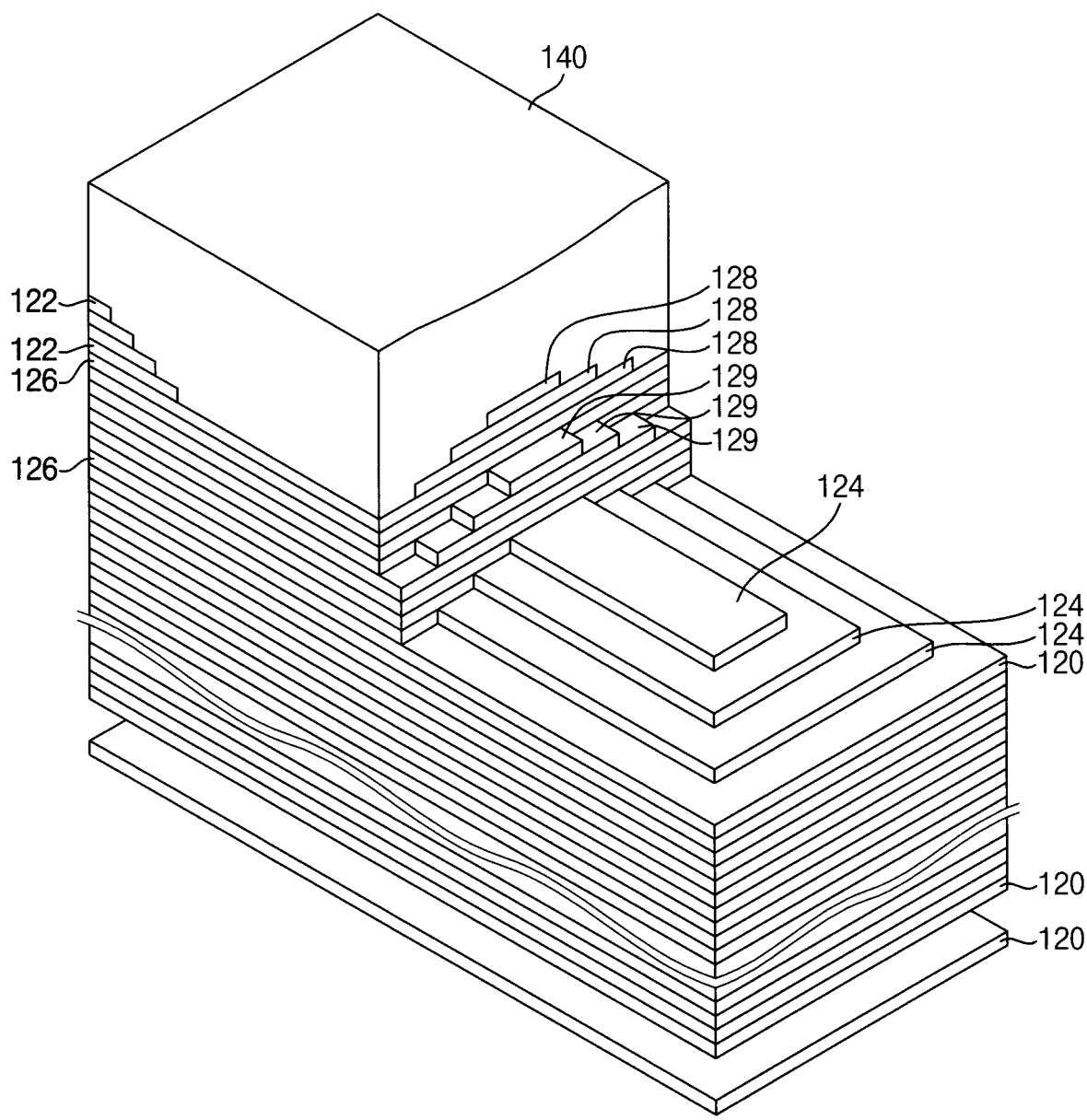
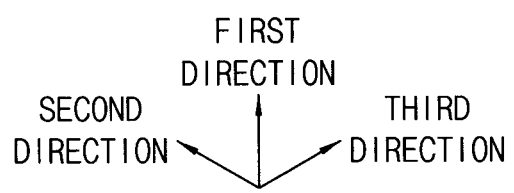

FIG. 16
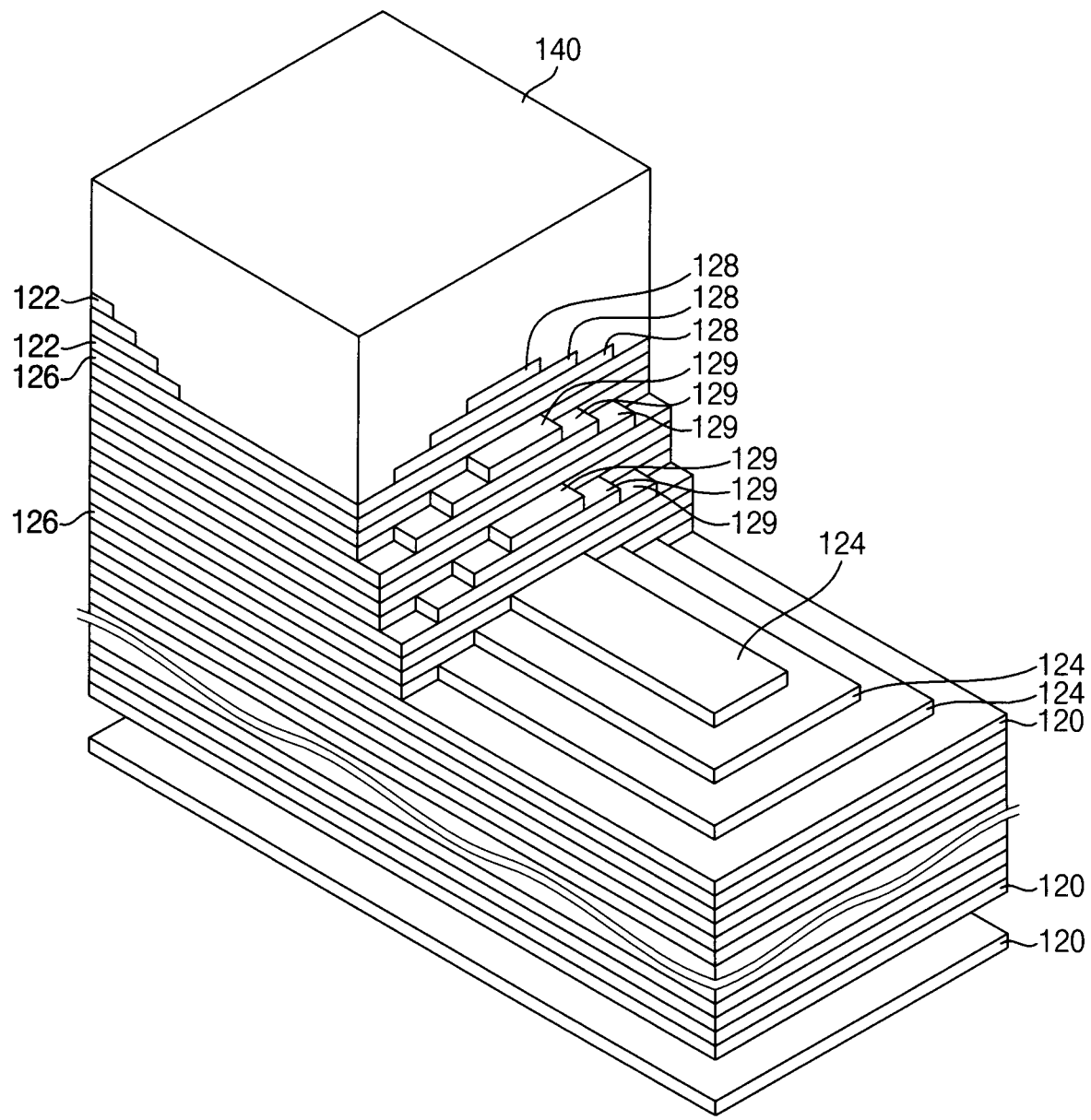
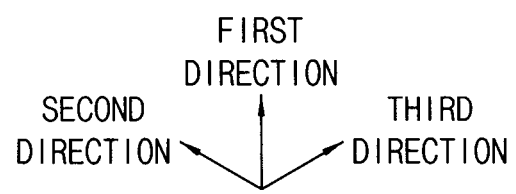

FIG. 18
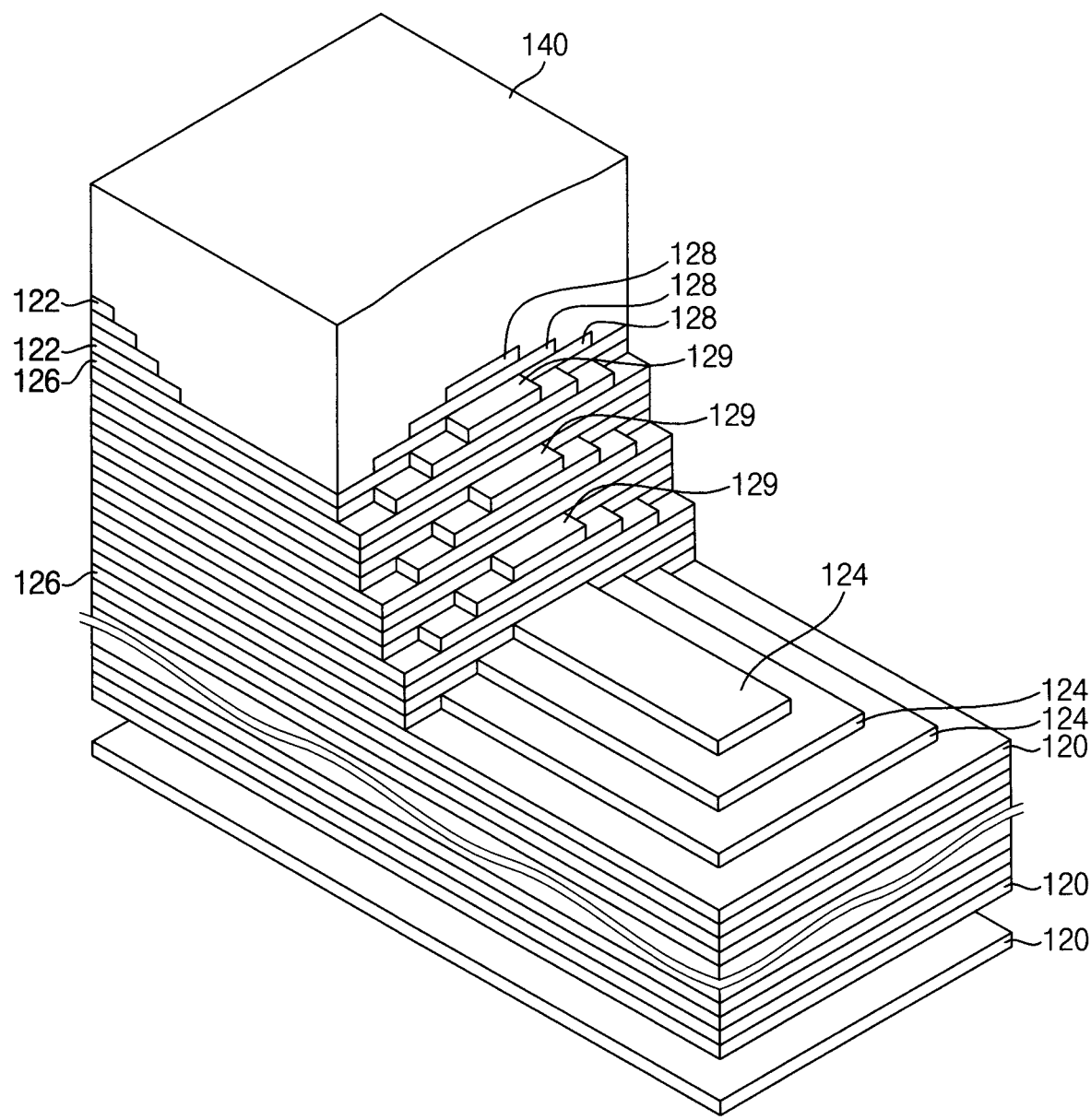
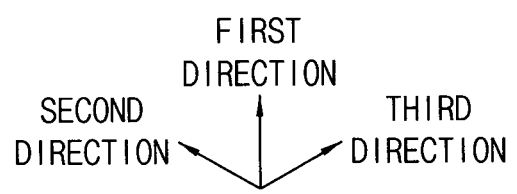

FIG. 20
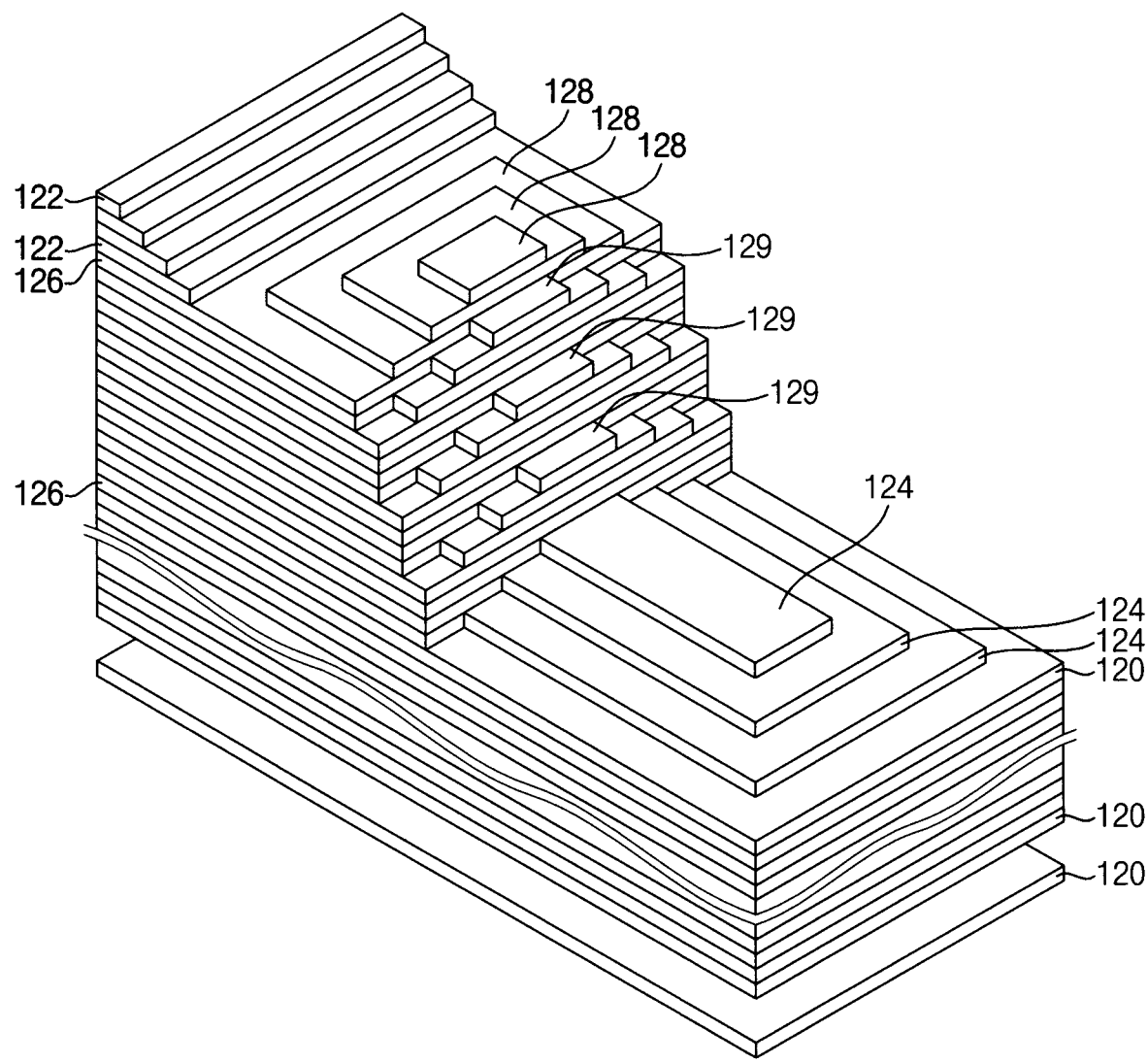
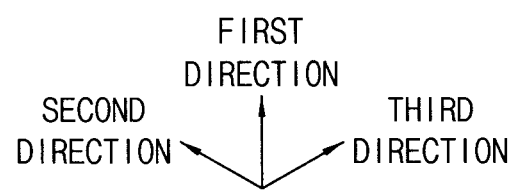

FIG. 22
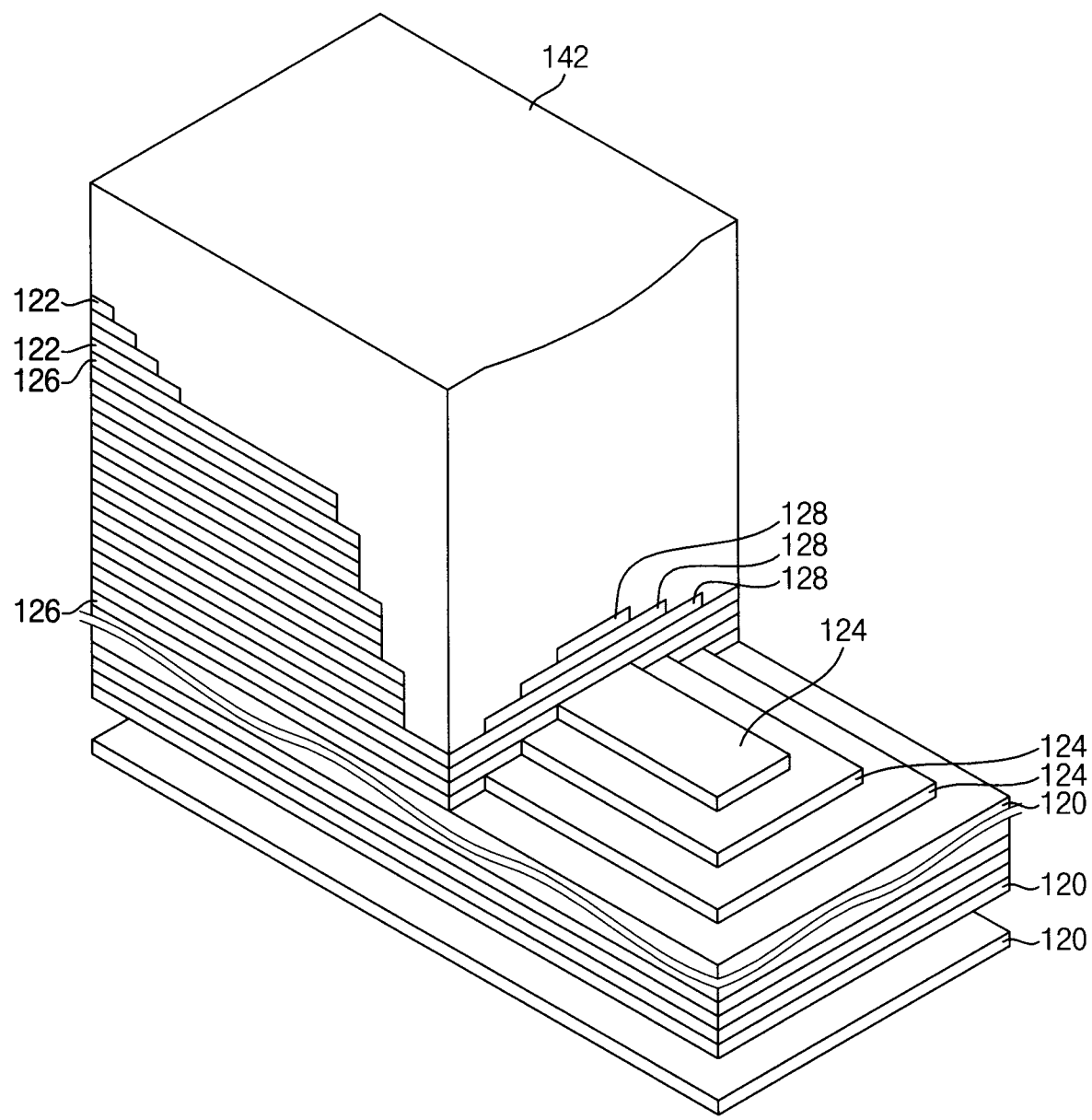
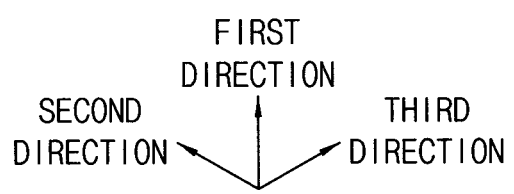

FIG. 24
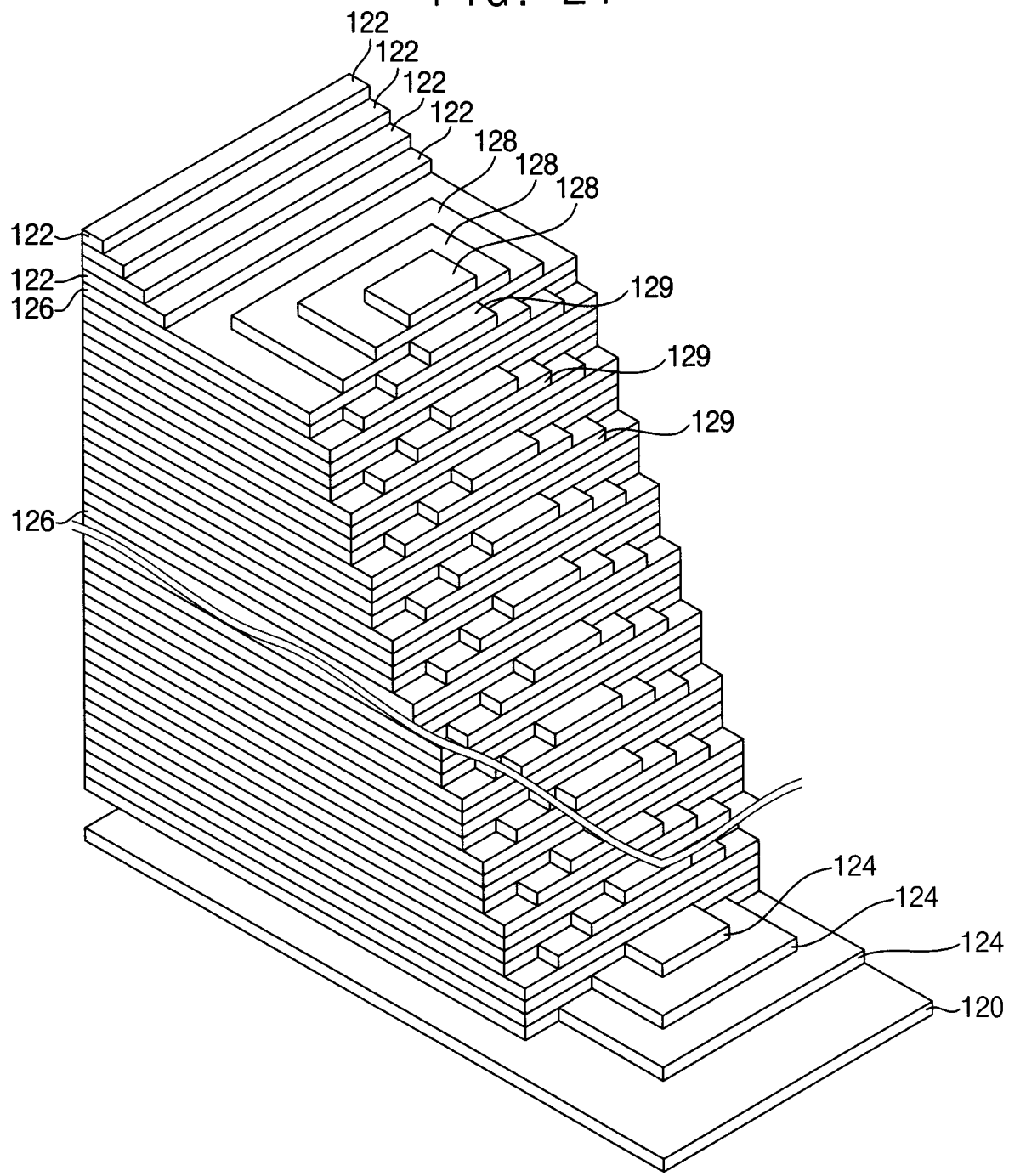
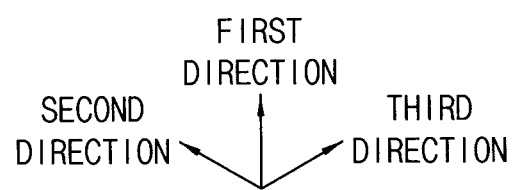

FIG. 25
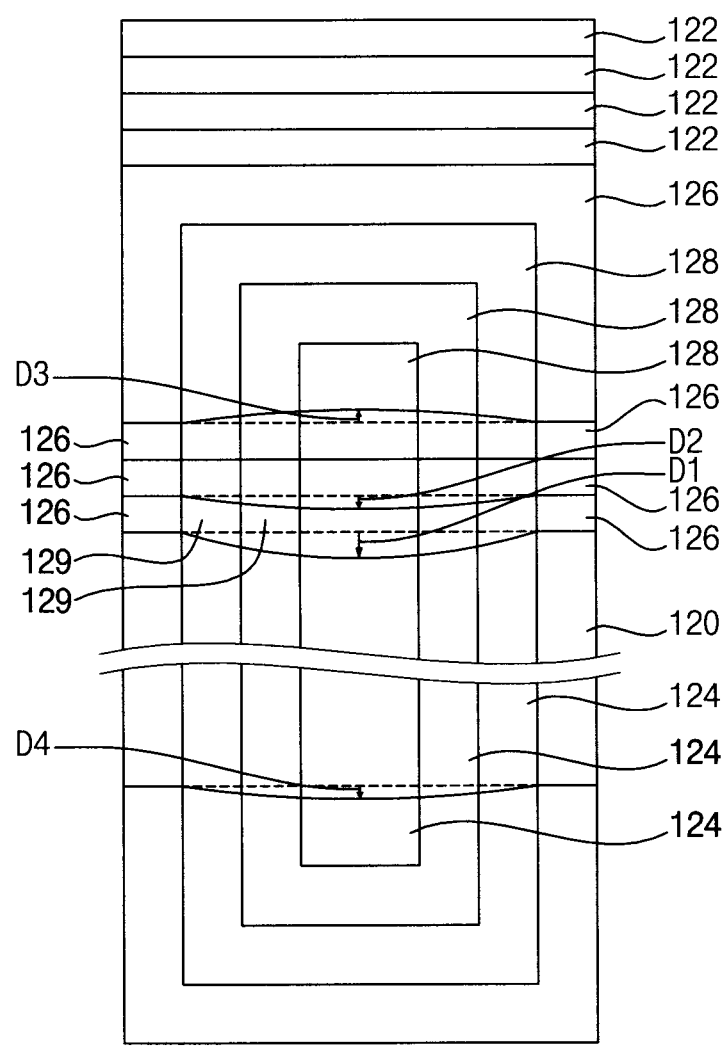
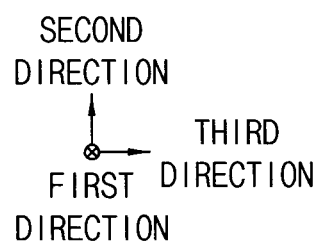

VERTICAL MEMORY DEVICES

CROSS-REFERENCE TO RELATED APPLICATION

This application claims priority under 35 USC § 119 to Korean Patent Application No. 10-2018-0092748, filed on Aug. 9, 2018 in the Korean Intellectual Property Office (KIPO), the contents of which are hereby incorporated by reference in their entirety.

BACKGROUND

1. Field

The disclosure relates to a vertical memory device. For example, the disclosure relates to a vertical memory device including gate electrodes stacked to have a stair structure.

2. Description of the Related Art

In a method of manufacturing a VNAND flash memory device, after alternately and repeatedly stacking sacrificial layers and insulation layers, the sacrificial layers and the insulation layers may be etched to form a mold having a stair structure in a stair structure region in which contact plugs are formed for the stair structure to be connected to upper wirings. The etching process may be performed using a photoresist pattern, and may be performed while gradually reducing an area of the photoresist pattern by a trimming process, so that the mold may have the stair structure.

Therefore, a reliable method of forming the mold will be beneficial to achieve steps having a desired shape and size.

SUMMARY

Example embodiments provide a vertical memory device having improved electrical characteristics.

According to example embodiments, there is provided a vertical memory device. The vertical memory device may include a substrate including a first region including a cell array formed thereon and a second region surrounding the first region, the second region including a stair structure formed thereon, gate electrodes stacked on the substrate to be spaced apart from each other in a first direction vertical to an upper surface of the substrate, each of the gate electrodes extending in a second direction parallel to the upper surface of the substrate and including a pad at an end portion thereof in the second direction, a channel extending through the gate electrodes in the first direction on the first region of the substrate, and contact plugs formed on the second region, the contact plugs extending in the first direction to contact the pads of the gate electrodes respectively. A first pad of the pads, in a plan view, may have a convex edge portion that is convex in a direction away from the first region of the substrate, and a second pad disposed on the first pad, in a plan view, may have a concave edge portion that is concave in a direction toward the first region of the substrate.

According to example embodiments, there is provided a vertical memory device. The vertical memory device may include a substrate including a first region which is a cell array region and a second region surrounding the first region, gate electrodes stacked on the substrate to be spaced apart from each other in a first direction vertical to an upper surface of the substrate, each of the gate electrodes extending in a second direction parallel to the upper surface of the substrate and including a pad at an end portion thereof in the second direction, a channel extending through the gate electrodes in the first direction on the first region of the substrate, and contact plugs extending in the first direction on the second region of the substrate to contact the pads of the gate electrodes respectively. Edge portions in the second direction of first pads among the pads, in a plan view, may be convex in a direction away from the first region, and the first pads may be arranged in a third direction parallel to the upper surface of the substrate and orthogonal to the second direction.

According to example embodiments, there is provided a vertical memory device. The vertical memory device may include a substrate including a first region which is a cell array region and a second region surrounding the first region, gate electrodes stacked on the substrate to be spaced apart from each other in a first direction vertical to an upper surface of the substrate, each of the gate electrodes extending in a second direction parallel to the upper surface of the substrate and including a pad being at an end portion thereof in the second direction, a channel extending through the gate electrodes in the first direction on the first region of the substrate, and contact plugs extending in the first direction on the second region of the substrate to contact the pads of the gate electrodes respectively. A boundary of edge portions in the second direction of first pads among the pads, in a plan view, may have a first curved shape that is convex in a direction away from the first region of the substrate, the first pads being arranged in a third direction parallel to the upper surface of the substrate and orthogonal to the second direction. A boundary of edge portions in the second direction of second pads among the pads, in a plan view, may have a second curved shape that is convex in the direction away from the first region of the substrate. A curvature of the second curved shape may be less than a curvature of the first curved shape.

In a vertical memory device in accordance with example embodiments, each of contact plugs may contact only ones of corresponding levels of a plurality of gate electrodes stacked to have a stair structure, and thus electrical shorts between the gate electrodes formed at a different level may be prevented.

BRIEF DESCRIPTION OF THE DRAWINGS

FIGS. 1 to 36 are plan views, cross-sectional views and perspective views illustrating a method of manufacturing a vertical memory device in accordance with some example embodiments.

DETAILED DESCRIPTION

Figure 2:
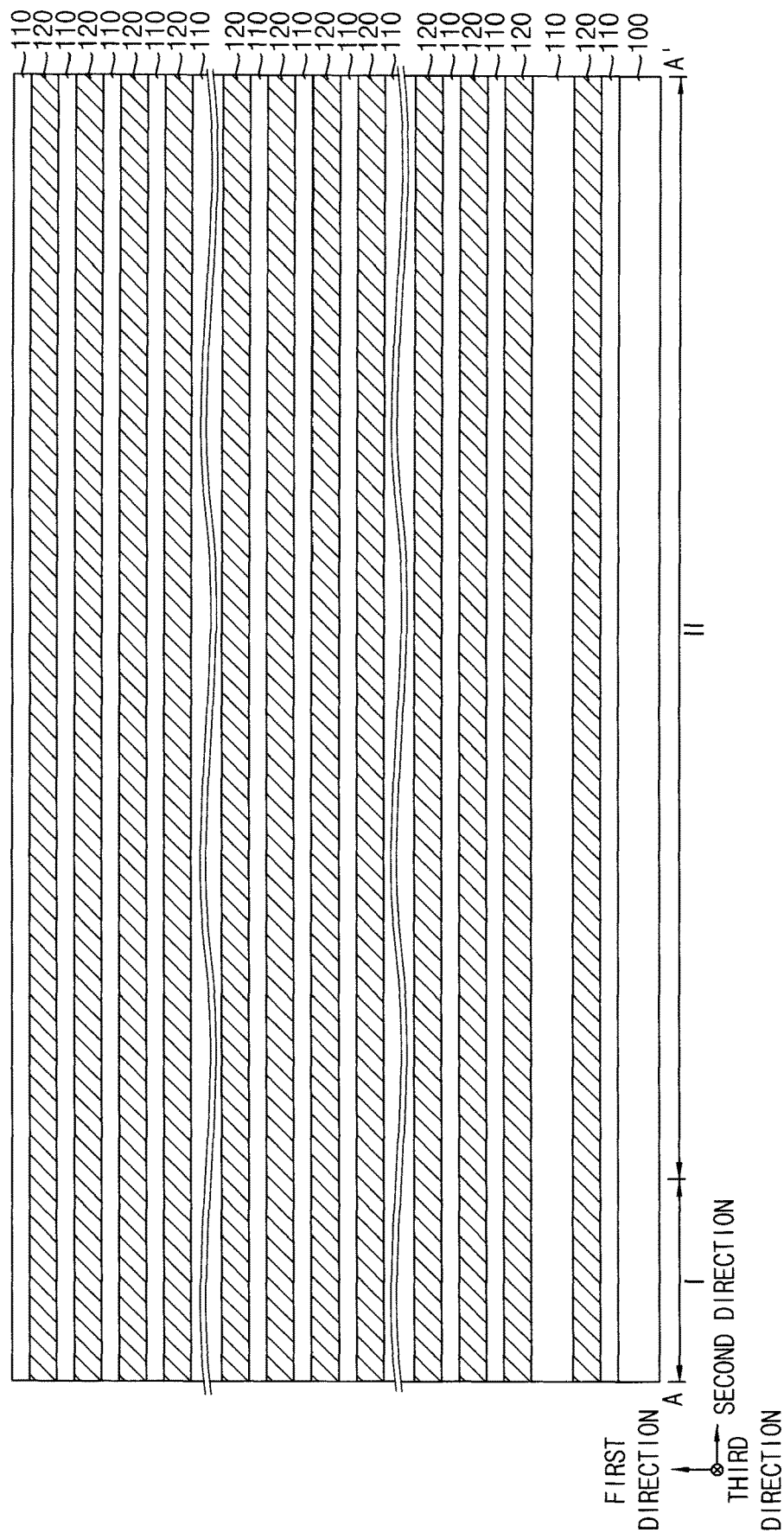

Example embodiments will be more clearly understood from the following detailed description taken in conjunction with the accompanying drawings.

FIGS. 1 to 36 are plan views, cross-sectional views and perspective views illustrating a method of manufacturing a vertical memory device in accordance with some example embodiments. For example, FIGS. 1, 9, 11, 13, 15, 17, 19, 21, 23, 25 and 35-36 are plan views, FIGS. 2 and 26-34 are cross-sectional views, and FIGS. 3-8, 10, 12, 14, 16, 18, 20, 22 and 24 are perspective views.

Plan views and perspective views except for FIG. 1 are drawings of a region X in FIG. 1; FIGS. 2, 26-29, 31 and 34 are cross-sectional views taken along a line A-A' of FIG. 1; and FIGS. 30 and 32-33 are cross-sectional views taken along a line B-B' of FIG. 1.

Hereinafter, a vertical direction substantially perpendicular to an upper surface of a substrate is defined as a first direction, and two directions intersecting with each other among horizontal directions substantially parallel to the upper surface of the substrate are defined as second and third directions, respectively. In example embodiments, the second and third directions are orthogonal to each other. Terms such as "parallel," "same," "equal," "flat," "planar," "coplanar," as used in this disclosure when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially parallel," "substantially the same," "substantially equal," "substantially flat," "substantially identical," or "substantially planar," may be exactly the same, equal, flat identical, or planar, or may be the same, equal, flat, identical, or planar within acceptable variations that may occur, for example, due to manufacturing processes.

Referring to FIG. 1, a substrate 100 may include a first region I and a second region II surrounding the first region I. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

The substrate 100 may include semiconductor materials, e.g., silicon, germanium, silicon-germanium, etc., or III-V compounds GaP, GaAs, GaSb, etc. In some embodiments, the substrate 100 may be a silicon-on-insulator (SOI) substrate or a germanium-on-insulator (GOI) substrate.

In example embodiments, the first region I of the substrate 100 may be a cell array region in which memory cells are formed, and the second region II of the substrate 100 may be a staircase region in which contact plugs connected to the memoir cells may be formed. The substrate 100 may further include a peripheral circuit region in which peripheral circuits for driving the memory cells may be formed, which may surround the second region II. For example, the staircase region and staircase in this disclosure may refer to a stair structure and/or stairs formed with a plurality of steps of which steps are connected in series.

The region X is a portion of the second region II of the substrate 100.

Figure 3:
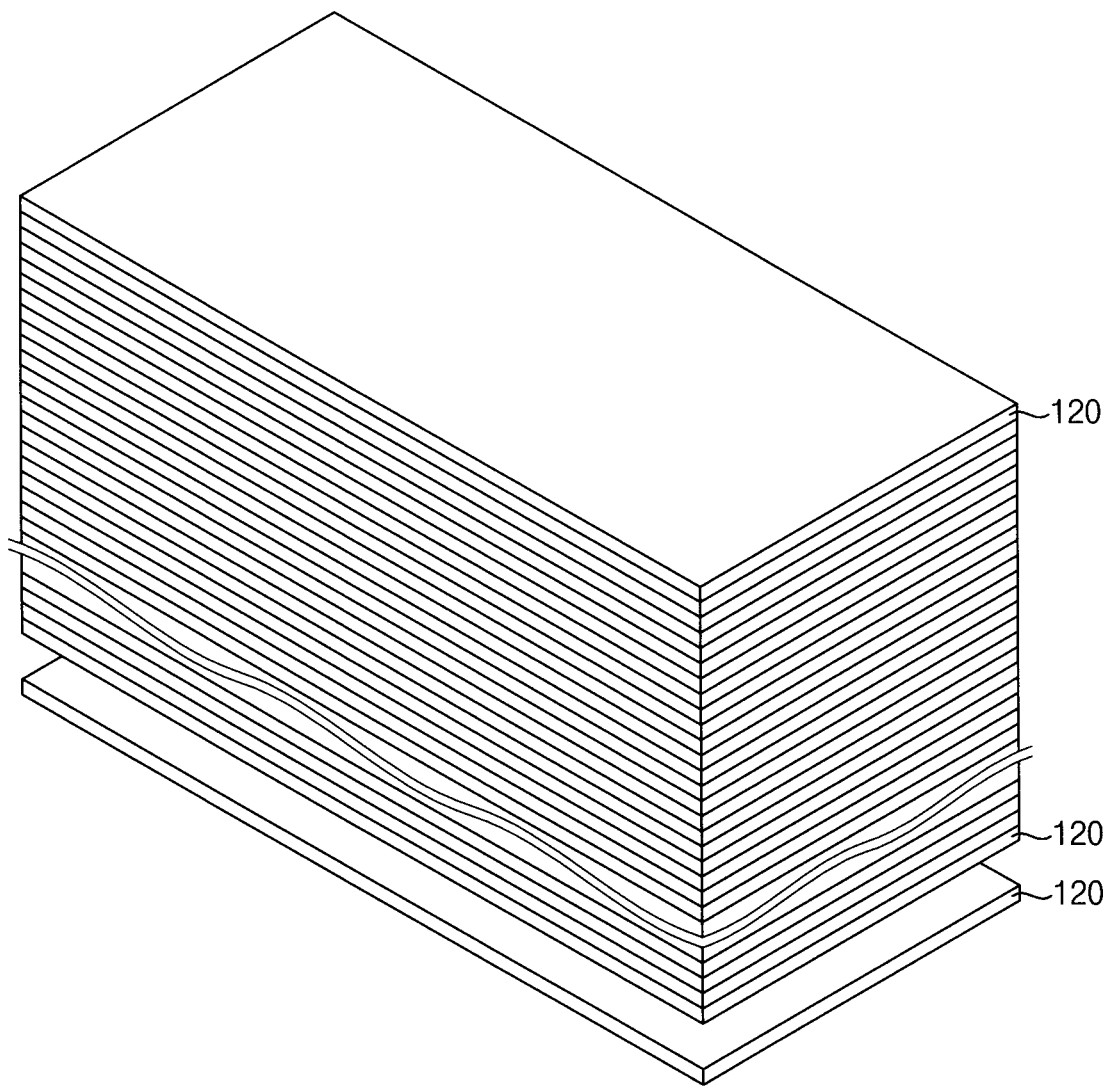

Referring to FIGS. 2 and 3, insulation layers 110 and sacrificial layers 120 may be alternately and repeatedly stacked on the substrate 100. Accordingly, a plurality of insulation layers 110 and a plurality of sacrificial layers 120 may be alternately stacked in the first direction.

In order to avoid the complexity of drawings, in all of the perspective views including FIG. 3, only the sacrificial layers 120 are illustrated, and the insulation layers 110 are not illustrated. However, it will be interpreted that there are insulation layers 110 between the sacrificial layers 120. Etching processes on the sacrificial layers 120 to be described below may be performed not only on the sacrificial layers 120 but also on the insulation layers 110 respectively formed on the sacrificial layers 120, wherein an adjacent insulation layer 110 and sacrificial layer 120 may form a pair. For convenience of explanation, the insulation layers 110 will not be described when the etching processes are described with reference to the perspective views.

The insulation layer 110 may include an oxide, e.g., silicon oxide, and the sacrificial layer 120 may include a material having an etching selectivity with respect to the insulation layer 110, e.g., a nitride such as silicon nitride.

Referring to FIG. 4, a first photoresist pattern (not shown) may be formed on the uppermost sacrificial layer 120 to cover the first region I of the substrate 100 and an edge portion of the second region II of the substrate 100 adjacent to the first region I, and the uppermost sacrificial layer 120 may be etched by an etching process using the first photoresist pattern as an etching mask to form a first sacrificial pattern 122 having a rectangular ring shape surrounding the sacrificial layer 120 of the uppermost level on the first region I of the substrate 100, in a plan view. For example, the first sacrificial pattern 122 may be continuously formed with the uppermost sacrificial layer 120 of the first region I, and may form a rectangle sacrificial pattern with the uppermost sacrificial layer 120 of the first region I.

However, FIG. 4 illustrates only a portion of the second region II of the substrate 100, that is, only the region X, and thus illustrates only a portion of the first sacrificial pattern 122 having the rectangular ring shape, that is, a portion having a bar shape extending in the third direction. Hereinafter, only a shape of various sacrificial patterns, which may be formed by etching the sacrificial layers 120, in the region X will be described in place of the entire shape thereof on the second region II of the substrate 100. In processes of forming a mold described with reference to the perspective views, a portion of the sacrificial layer 120 on the first region I of the substrate 100 may be covered by a photoresist pattern/layer not to be etched, and thus the first region I of the substrate 100 will not be described hereinafter.

After forming the first sacrificial pattern 122, the first photoresist pattern may be removed by, e.g., an ashing process and/or a stripping process.

Referring to FIG. 5, a second photoresist pattern 132 covering the first sacrificial pattern 122 and having a length in the second direction greater than that of the first sacrificial pattern 122 may be formed on the sacrificial layer 120 of the 2nd level from the uppermost level. A third photoresist pattern 134 which may cover a portion of the sacrificial layer 120 of the uppermost level on the region X may be formed on the sacrificial layer 120 of the 2nd level from the uppermost level. The third photoresist pattern 134 may be spaced apart from the second photoresist pattern 132, and may have a rectangular shape in a plan view. Hereinafter, an nth level from the uppermost level is simply indicated by an nth level. The sacrificial layer 120 of the 2nd level may be etched using the second and third photoresist patterns 132 and 134 as an etching mask.

Accordingly, one more first sacrificial pattern 122 having a length in the second direction greater than that of the first sacrificial pattern 122 of the uppermost level (the 1st level) may be formed at the 2nd level under the first sacrificial pattern 122 of the 1st level, and a second sacrificial pattern 124 being spaced apart from the first sacrificial pattern 122 of the 2nd level and having a rectangular shape in a plan view may be also formed at the 2nd level. In example embodiments, a plurality of second sacrificial patterns 124 may be formed to be spaced apart from each other in the third direction, and one of the second sacrificial patterns 124 is illustrated in FIG. 5.

Figure 6:
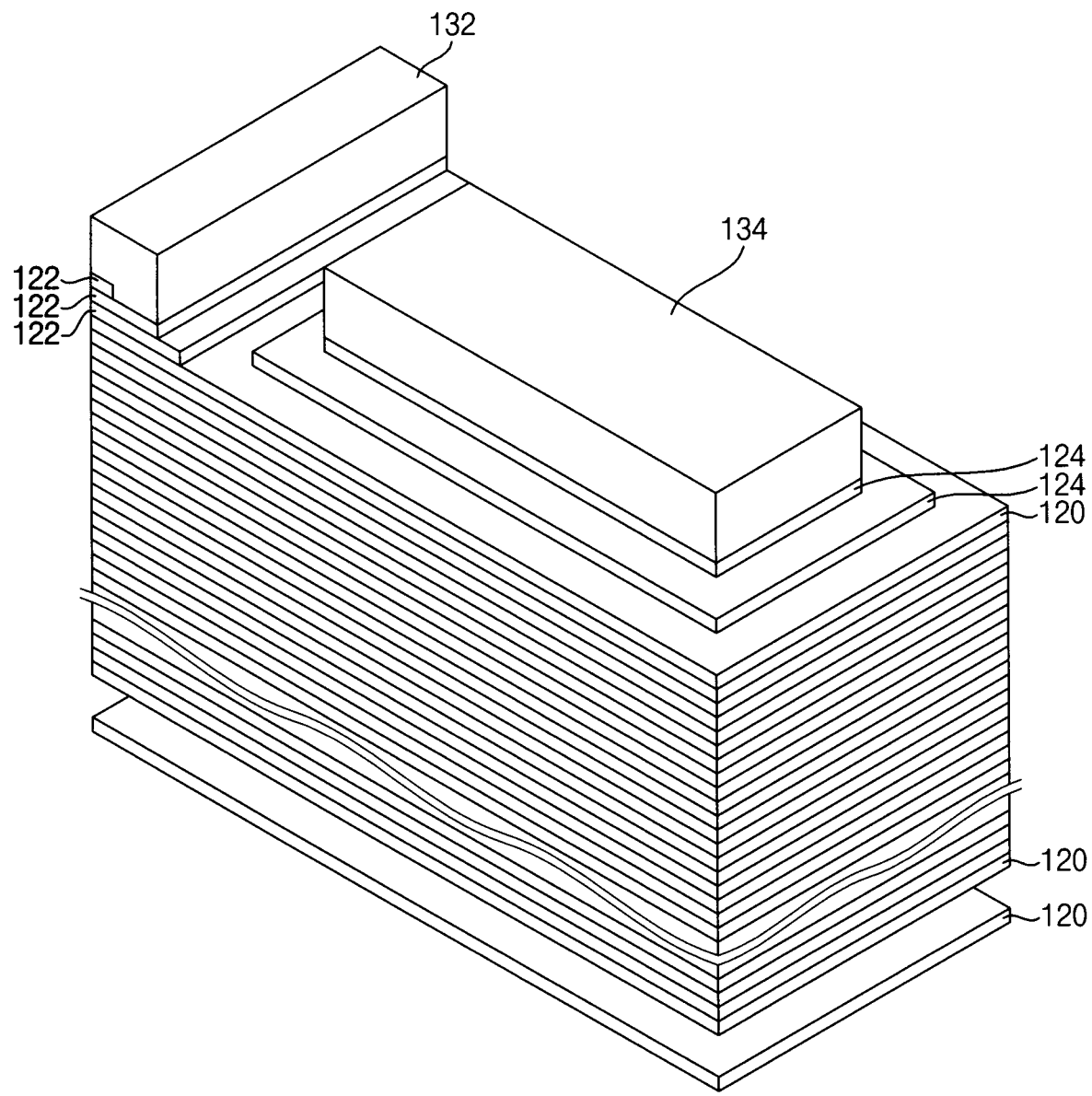

Referring to FIG. 6, a first trimming process may be performed to reduce an area of each of the second and third photoresist patterns 132 and 134, and the first and second sacrificial patterns 122 and 124 and the sacrificial layer 120 of the 3rd level may be etched using the reduced second and third photoresist patterns 132 and 134 as an etching mask. For example, when the first trimming process is completed, a portion of the sacrificial layer 120 of the 3rd level and a portion of the first sacrificial pattern 122 of the second level may be exposed by the second and third photoresist patterns 132 and 134. The exposed portions of the sacrificial layer 120 of the 3rd level and the exposed portion of the first sacrificial pattern 122 of the 2nd level may be removed by the etching process, and the etching process may be stopped when the insulation layer 110 disposed between the 3rd and 4th levels of sacrificial layers 120 is exposed by the etching process. For example, the etching process may be an anisotropic etching process, e.g., a dry etch process using a plasma. For example, substantially the same thicknesses of the sacrificial layer 120 of the 3rd level and the first sacrificial pattern 122 of the 2nd level may be removed from the top of the exposed portions by the etching process so that the structure shown in FIG. 6 is achieved by the etching process. After etching the exposed portions of the first and second sacrificial patterns 122 and 124 and the exposed portions of the sacrificial layer 120 of the 3rd level by the second and third photoresist patterns 132 and 134 until insulation layers 110 respectively formed under the first and second sacrificial patterns 122 and 124 and the sacrificial layer 120 of the 3rd level are exposed, the exposed portion of the insulation layers 110 may be removed, e.g., by another etching process.

Accordingly, the length in the second direction of the first sacrificial pattern 122 of the 2nd level may be reduced, and one more first sacrificial pattern 122 may be formed at the 3rd level. Also, the area of the second sacrificial pattern 124 of the 2nd level may be reduced, and one more second sacrificial pattern 124 may be formed at the 3rd level.

In example embodiments, the first trimming process may be performed by performing an exposure process on portions of the second and third photoresist patterns 132 and 134, and removing unexposed portions thereof through a development process. Alternatively, the first trimming process may be performed by performing the exposure process on portions of the second and third photoresist patterns 132 and 134, and the exposed portions thereof may be removed through a development process.

Figure 7:
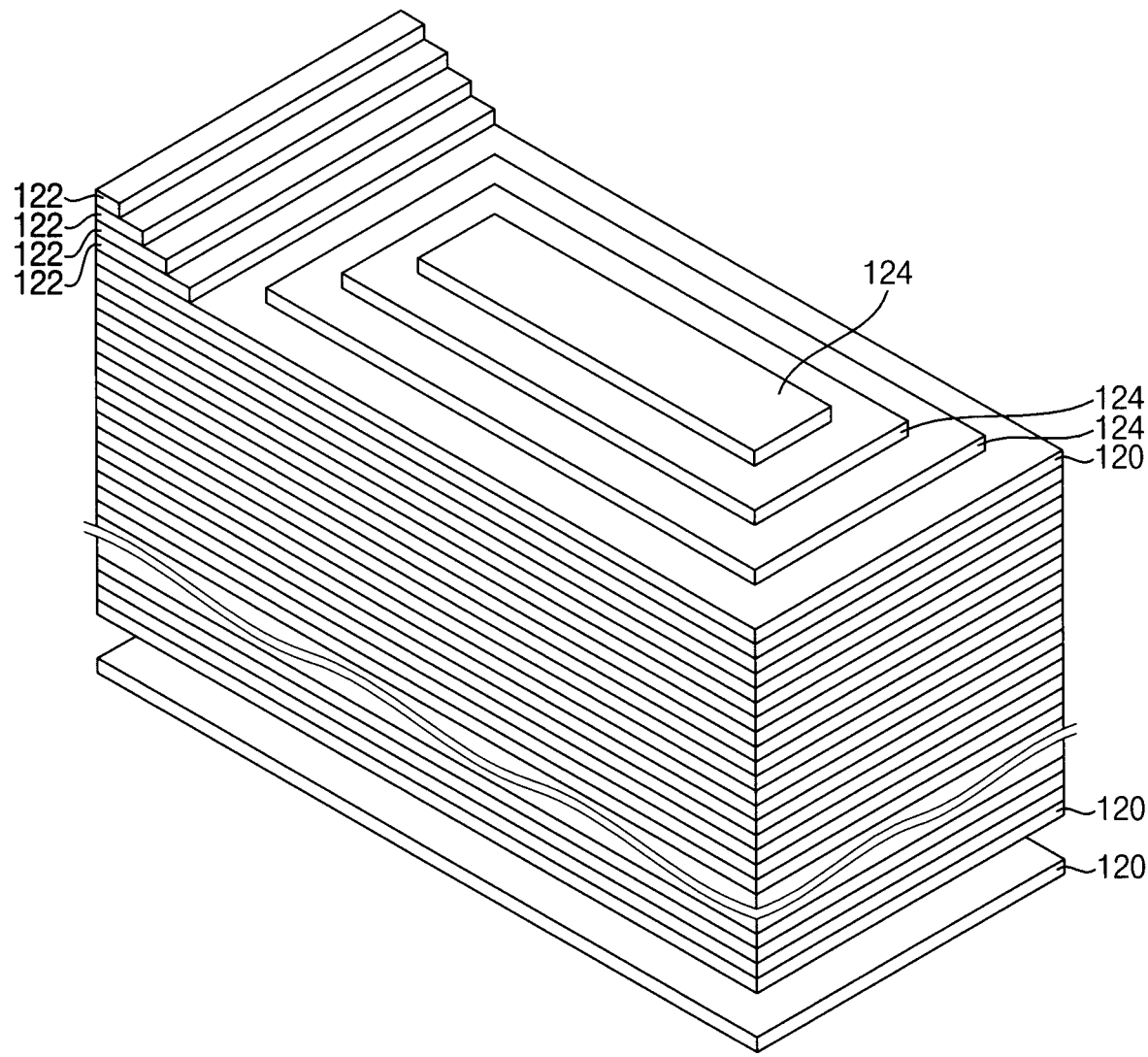

Referring to FIG. 7, a second trimming process and an etching process may be performed.

For example, after reducing the areas of the second and third photoresist patterns 132 and 134, the first and second sacrificial patterns 122 and 124 and the sacrificial layer 120 of the 4th level may be etched using the reduced second and third photoresist patterns 132 and 134 as an etching mask.

Accordingly, the lengths in the second direction of the first sacrificial patterns 122 of the 2nd and 3rd levels may be reduced, and one more first sacrificial pattern 122 may be formed at the 4th level. Also, the areas of the second sacrificial patterns 124 of the 2nd and 3rd levels may be reduced, and one more second sacrificial pattern 124 may be formed at the 4th level.

Thereafter, the second and third photoresist patterns 132 and 134 may be removed.

Accordingly, the first sacrificial patterns 122 may be stacked to have a staircase shape at four levels on the sacrificial layer 120 of the 5th level, and the second sacrificial patterns 124 may be stacked to have a staircase shape at three levels on the sacrificial layer 120 of the 5th level. However, the inventive concept may not be limited thereto, and each of the first and second sacrificial patterns 122 and 124 may be formed at a larger number of levels or a smaller number of levels.

A method of forming the first and second sacrificial patterns 122 and 124 at four levels and three levels respectively has been described above including performing the etching process three times using the second and third photoresist patterns 132 and 134 as an etching mask (thus, performing the trimming process twice). However, the inventive concept is not limited thereto, and the etching process (and the trimming process) may be performed more or less times than above.

Referring to FIGS. 8 and 9, a fourth photoresist pattern 140 may be formed on the sacrificial layer 120 of the 5th level to cover the first sacrificial patterns 122, and portions of the second sacrificial patterns 124 adjacent to the first sacrificial patterns 122.

In example embodiments, in a plan view, the fourth photoresist pattern 140 may have a bar shape extending in the third direction as a whole. However, an edge portion of the fourth photoresist pattern 140 formed on the second sacrificial patterns 124 may have a convex curved shape in a direction away from the first region I of the substrate 100 in the second direction. For example, the edge portion of the fourth photoresist pattern 140 in the second direction may not be a linear shape but may be a curved shape extending in the third direction. For example, in a plan view, a boundary of the convex edge portion of the fourth photoresist pattern 140 may be spaced apart from a straight line which connects boundaries of edge portions of the fourth photoresist pattern 140 not formed on the second sacrificial patterns 124, e.g., formed on the sacrificial layer 120 of the 5th level, with each other, by a maximum of a first distance D1 along the second direction. For example the curved portion of the fourth photoresister pattern 140 may protrude to the second direction, and the maximum protruding distance may be the first distance D1. For example, the end line of the fourth photoresist pattern 140 may have a wave form in a plan view having recesses and protrusions in the second direction, and the first distance D1 may be a distance between a recessed portion and a protruding portion of the fourth photoresist pattern 140 in the second direction in a plan view.

Figure 10:
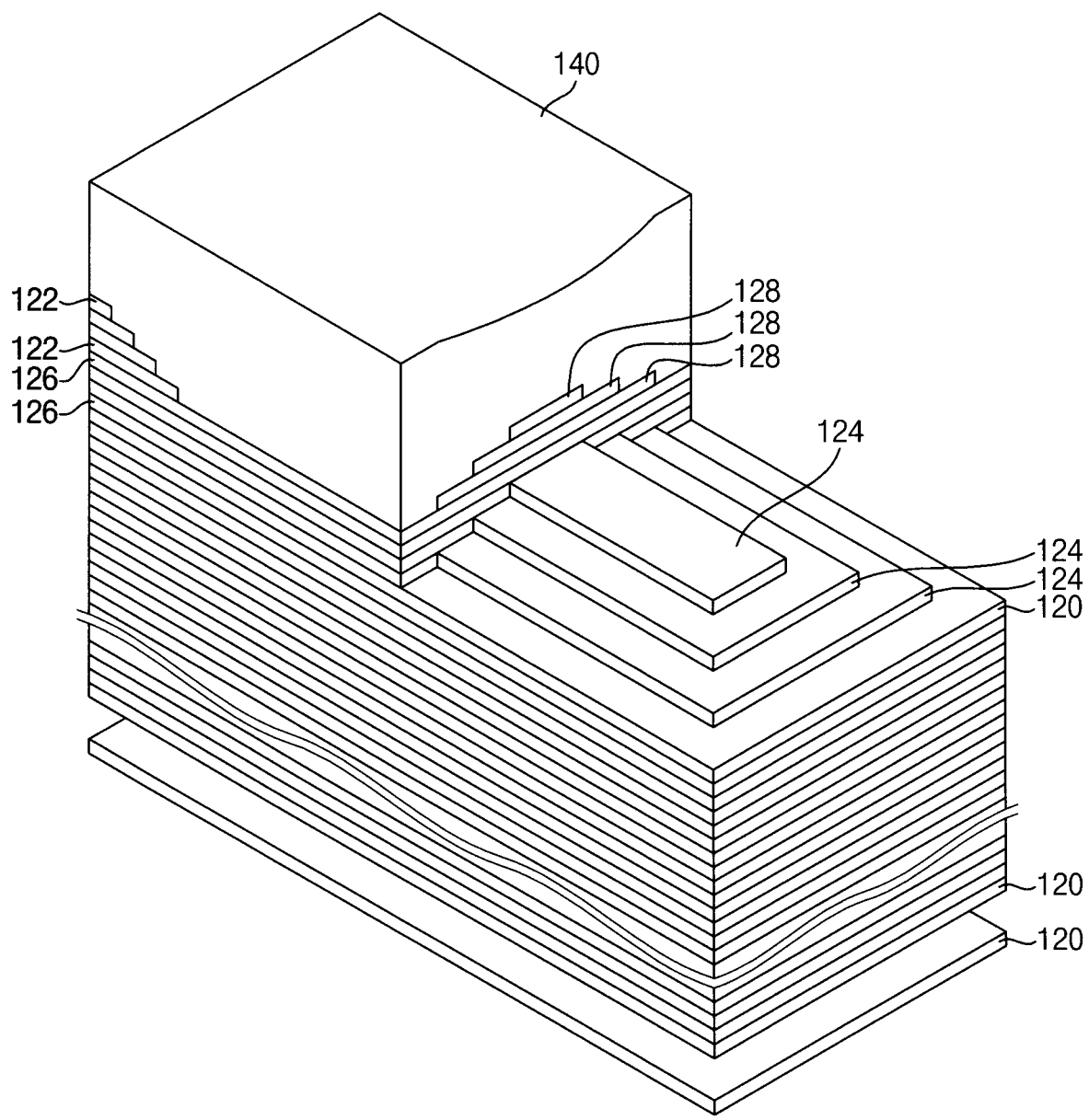
Figure 11:
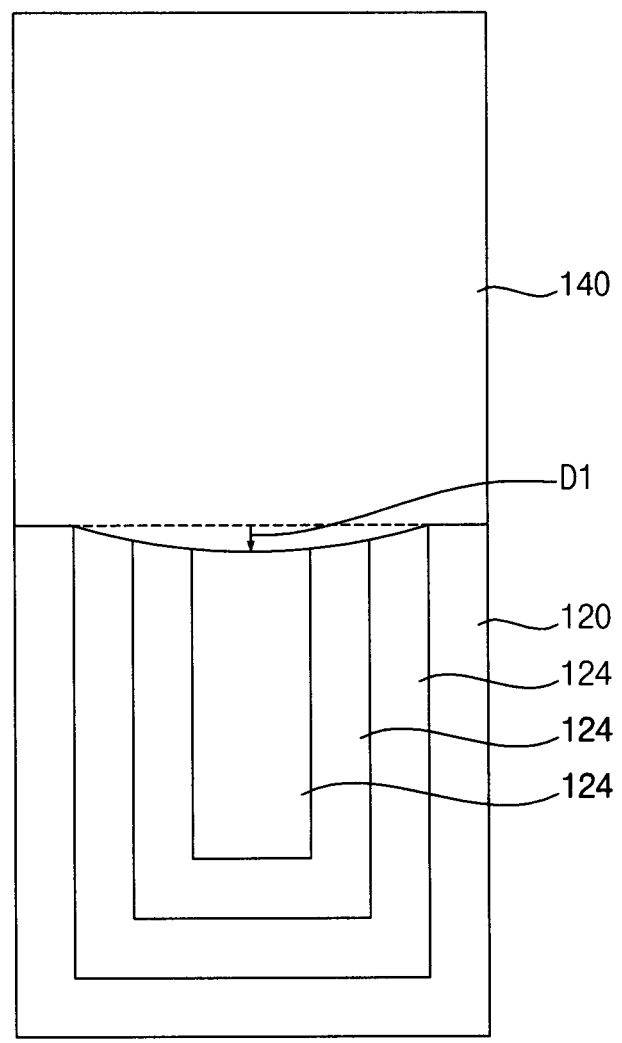

Referring to FIGS. 10 and 11, the second sacrificial patterns 124 and the sacrificial layers 120 of the 5th to 8th levels may be etched using the fourth photoresist pattern 140 as an etching mask.

Accordingly, third sacrificial patterns 126 may be formed at the 5th to 8th levels, respectively, to have a length in the second direction greater than those of the first sacrificial patterns 122, and shapes of portions of the second sacrificial patterns 124 not covered by the fourth photoresist pattern 140 may be transferred from the 2nd to 4th levels to the 6th to 8th levels, respectively. For example, the etching process may remove four layers of sacrificial patterns/layers exposed by the fourth photoresist pattern 140. For example, the second sacrificial patterns 124 formed on the sacrificial layer 120 of the 5th level may be removed by the etching process, and the second sacrificial patterns 124 may be respectively transferred to 7th to 9th levels to form substantially the same shapes as the second sacrificial patterns 124 formed at the 2nd to 4th levels. The second sacrificial patterns 124 covered by the fourth photoresist pattern 140 may not be removed, and may be transformed into fourth sacrificial patterns 128 and may remain on the third sacrificial pattern 126 of the 5th level.

As described above, the edge portion of the fourth photoresist pattern 140 on the second sacrificial patterns 124 may have a convex curved shape in the second direction, and thus edge portions of the fourth sacrificial patterns 128 etched by using the fourth photoresist pattern 140 and remaining on the third sacrificial pattern 126 of the 5th level may also have a convex curved shape in the second direction.

Above example describes that four levels of sacrificial patterns/layers are etched by the etching process using the fourth photoresist pattern 140, however, the inventive concept is not limited thereto, and five or more levels of sacrificial layers 120 and/or patterns 124 or three or less levels of sacrificial layers/patterns may be etched by the etching process. For example, one more levels of layers/patterns than the total layers of the second sacrificial patterns 124 may be etched by the etching process. In the above example, the second sacrificial patterns 124 are formed in three levels, i.e., 2nd to 4th levels, and thus four levels of sacrificial layers/patterns, that is, the 5th to 8th levels are etched by the etching process.

Figure 13:
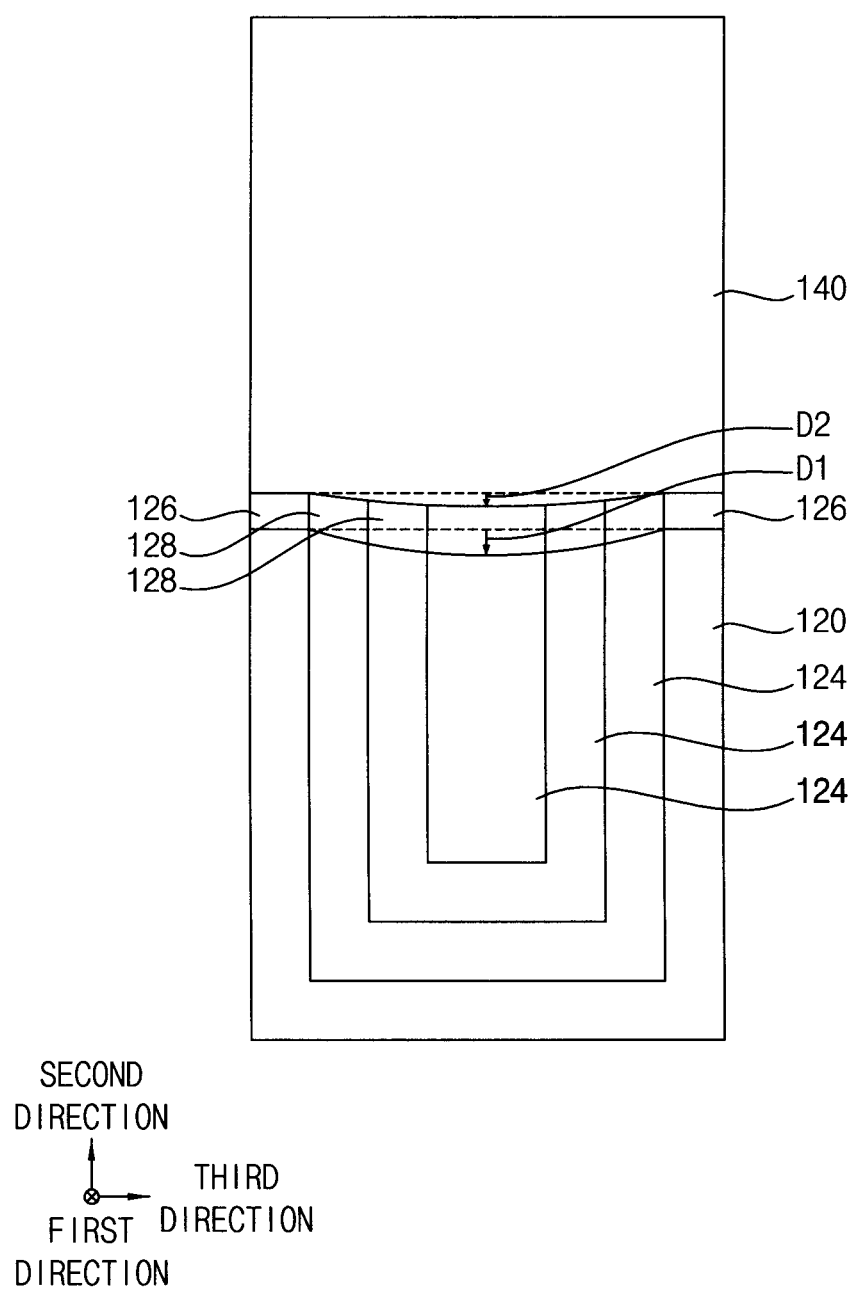

Referring to FIGS. 12 and 13, a third trimming process may be performed to reduce/remove an area of the fourth photoresist pattern 140, and thus portions of the fourth sacrificial patterns 128 may be exposed.

In example embodiments, in a plan view, similarly to the shape before the third trimming process, the fourth photoresist pattern 140 may have a bar shape extending in the third direction, however, an edge portion in the second direction of the fourth photoresist pattern 140 on the fourth sacrificial patterns 128 may have a convex curved shape in a direction away from the first region I of the substrate 100 along the second direction. For example, an edge of the fourth photoresist pattern 140 may extend in the third direction, and the end line of the fourth photoresist pattern 140 may not have a straight line but have a curved shape, e.g., protruding shape in the second direction, in a plan view after the trimming process. For example, in a plan view, a boundary of the edge convex portion of the fourth photoresist pattern 140 may be spaced apart from a straight line which connects boundaries of edge portions of the fourth photoresist pattern 140 not formed on the fourth sacrificial patterns 128, e.g., formed on the third sacrificial pattern 126, with each other, by a maximum of a second distance D2 along the second direction. In example embodiments, the second distance D2 may be smaller than the first distance D1.

For example, when the third trimming process is performed to reduce the area of the fourth photoresist pattern 140 by an exposure process and a development process, the fourth sacrificial patterns 128 may have a staircase shape on a portion of the third sacrificial pattern 126 of the 5th level on which the fourth photoresist pattern 140 may be formed, and thus a thickness of a portion of the fourth photoresist pattern 140 formed on the fourth sacrificial patterns 128 may be smaller than a thickness of a portion of the fourth photoresist pattern 140 formed on the third sacrificial pattern 126 of the 5th level. For example, the fourth sacrificial patterns 128 may be stacked to have a staircase shape, and thus the thickness of the fourth photoresist pattern 140 may be reduced toward the fourth sacrificial pattern 128 of the uppermost level. For example, the fourth photoresist pattern 140 formed on an upper level of the fourth sacrificial pattern 128 may be thinner than the fourth photoresist pattern 140 formed on a lower level of the fourth sacrificial pattern 128 and/or formed on the third sacrificial pattern 126.

Accordingly, when the third trimming process is performed, a portion of the fourth photoresist pattern 140 having a relatively small thickness may be removed by a relatively large area, e.g., in a plan view, and the convex portion of the fourth photoresist pattern 140 may be removed by a relatively large amount, e.g., in a plan view. As a result, a distance from a boundary of the edge convex portion of the fourth photoresist pattern 140 on the fourth sacrificial patterns 128 to a straight line connecting boundaries of edge portions, in a plan view, of the fourth photoresist pattern 140 not formed on the fourth sacrificial patterns 128, e.g., formed on the third sacrificial patterns 126, with each other may be smaller than the previous one.

Figure 15:
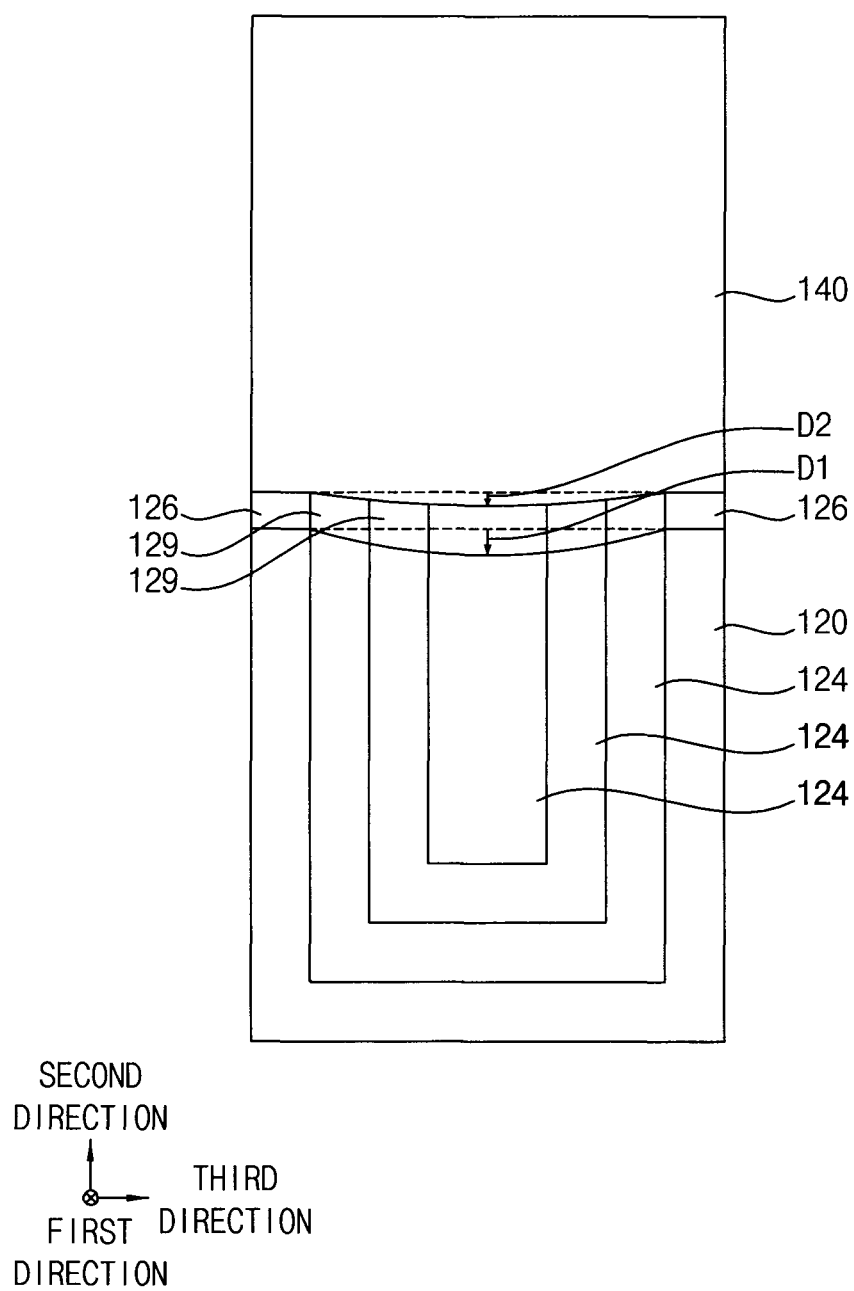

Referring to FIGS. 14 and 15, the exposed fourth sacrificial patterns 128, the second and third sacrificial patterns 124 and 126 and the sacrificial layers 120 of the 9th to 12th levels may be etched using the fourth photoresist pattern 140 as an etching mask.

Accordingly, the third sacrificial patterns 126 of the 5th to 8th levels may have the same length as each other in the second direction and may have a smaller length than the previous one in the second direction, and four more third sacrificial patterns 126 may be formed at the 9th to 12th levels, respectively, to have the same length as each other in the second direction and may have a length greater than that of the third sacrificial patterns 126 of the 5th to 8th levels in the second. Shapes of the exposed portions of the fourth sacrificial patterns 128 of the 2nd to 4th levels may be transferred to the 6th to 8th levels, respectively, which may be referred to as fifth sacrificial patterns 129. The shapes of portions of the second sacrificial patterns 124 not covered by the fourth photoresist pattern 140 may be transferred from the 6th to 8th levels to the 10th to 12th levels, respectively.

As described above, the edge portion of the fourth photoresist pattern 140 on the fourth sacrificial patterns 128 has the convex curved shape in the second direction, and thus edge portions of the fifth sacrificial patterns 129 formed at the 6th to 8th levels and etched by using the fourth photoresist pattern 140 may also have a convex curved shape in the second direction. However, the curved shape of a first boundary of the edge convex portions of the fifth sacrificial patterns 129 at the 6th to 8th levels, which may be relatively close to the first region I of the substrate 100, may be gentler than the curved shape of a second boundary of the edge convex portion of the fifth sacrificial patterns 129, which may be relatively far from the first region I of the substrate 100. For example, the curvature of boundary of the fifth sacrificial patterns 129 may be greater than the curvature of boundary of the fourth sacrificial patterns 128 in a plan view. The term "curvature" as used in this disclosure when referring to a curved line or shape means a reciprocal of a radius of the curved line or shape as used in mathematics. For example, curved lines or shapes having the same curvature may mean that the radiuses of the curved lines or shapes are the same. For example, the first boundary of the fifth sacrificial patterns 129 of the 6th to 8th levels may correspond to an end line of the third and fourth sacrificial patterns 126 and 128 of the 4th and 5th levels respectively in a plan view, and the second boundary may be the end line of the fifth sacrificial patterns 129 opposite to the first boundary. The second boundary of the fifth sacrificial patterns 129 of the 6th to 8th levels may correspond to an end line of the third sacrificial pattern 126 of the 9th level. This first and second boundary description may be similarly applied to different levels of fifth sacrificial patterns 129 with respect to corresponding patterns in the following descriptions. For example, a second boundary of a fifth sacrificial pattern 129 of an upper layer may correspond to a first boundary of a fifth sacrificial pattern 129 of a lower layer.

Figure 17:
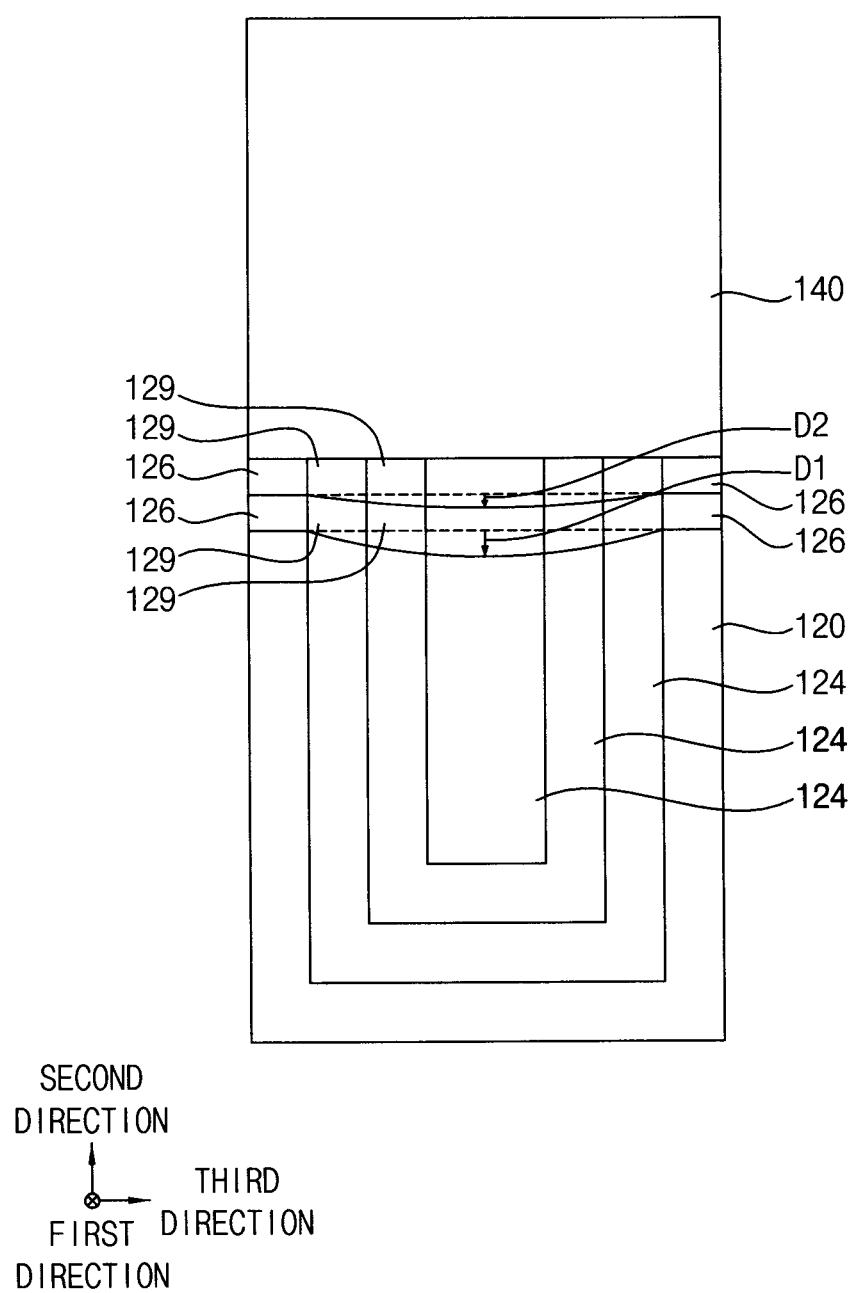

Referring to FIGS. 16 and 17, additional patterning processes substantially the same as or similar to the processes described with respect to FIGS. 12 to 15 may be performed.

For example, after reducing the area of the fourth photoresist pattern 140 by a fourth trimming process to expose portions of the fourth sacrificial patterns 128, the exposed portions of the fourth sacrificial patterns 128, the fifth sacrificial patterns 129, the second and third sacrificial patterns 124 and 126, and the sacrificial layers of the 13th to 16th levels may be etched using the reduced fourth photoresist pattern 140 as an etching mask.

Accordingly, the third sacrificial patterns 126 of the 5th to 8th levels may have the same length as each other and may have a smaller length than the previous one in the second direction, and the third sacrificial patterns 126 of the 9th to 12th levels may have the same length as each other and may have a smaller length than the previous one in the second direction. Additionally, four more third sacrificial patterns 126 may be formed at the 13th to 16th levels, respectively, to have the same length as each other and to have a length greater than those of the third sacrificial patterns 126 of the 5th to 12th levels in the second direction. Shapes of portions of the exposed fourth sacrificial patterns 128 may be transferred from the 2nd to 4th levels to the 6th to 8th levels, respectively, to form the fifth sacrificial patterns 129, and the shapes of the fifth sacrificial patterns 129 of the 6th to 8th levels may be transferred to 10th to 12th levels, respectively. The portions of the second sacrificial patterns 124 not covered by the fourth photoresist pattern 140 may be moved from the 10th to 12th levels to the 14th to 16th levels, respectively. Patterns described to be moved to other layers and/or other levels in this disclosure may refer to transferring shapes of patterns to other layers and/or levels by a photolithography process and/or by an etching process.

In certain example embodiments, the edge portion in the second direction of the fourth photoresist pattern 140 may have a linear shape, which may be a bar shape, extending in the third direction. For example, the end line of the fourth photoresist pattern 140 extending in the third direction may have a straight line shape in a plan view. For example, the edge portion of the fourth photoresist pattern 140 on the fourth sacrificial patterns 128 may have a linear, or bar shape extending in the third direction. For example, as described in the third trimming process, the portion of the fourth photoresist pattern 140 having a relatively small thickness, e.g., a portion of the fourth photoresist pattern 140 on the fourth sacrificial pattern 128 of the uppermost level may be removed by a relatively large area, e.g., in a plan view, through the fourth trimming process so that the convex portion of the fourth photoresist pattern 140 may be removed, and that the edge portion of the fourth photoresist pattern 140 may have a linear shape.

Accordingly, a first boundary of the edge portions relatively close to the first region I of the substrate 100 of the fifth sacrificial patterns 129, which may be etched by using the fourth photoresist pattern 140 and formed at the 6th to 8th levels, respectively, may have a linear shape in a plan view, unlike a second boundary of the edge portions relatively far from the first region I of the substrate 100 of the fifth sacrificial patterns 129.

The opposite boundaries of edge portions in the second direction of the fifth sacrificial patterns 129, which may be moved to the 10th to 12th levels, may maintain the original shapes at the 6th to 8th levels.

Figure 19:
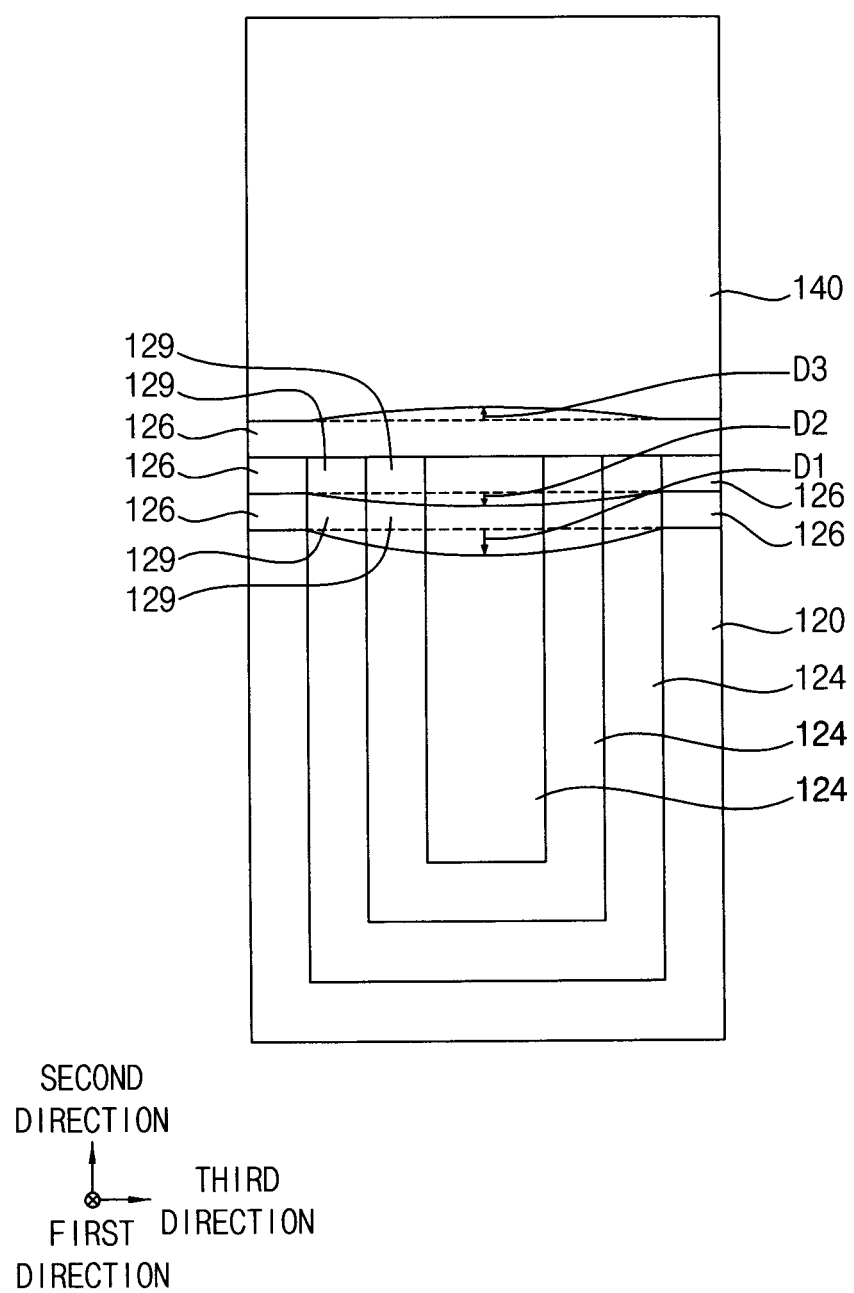
Figure 21:
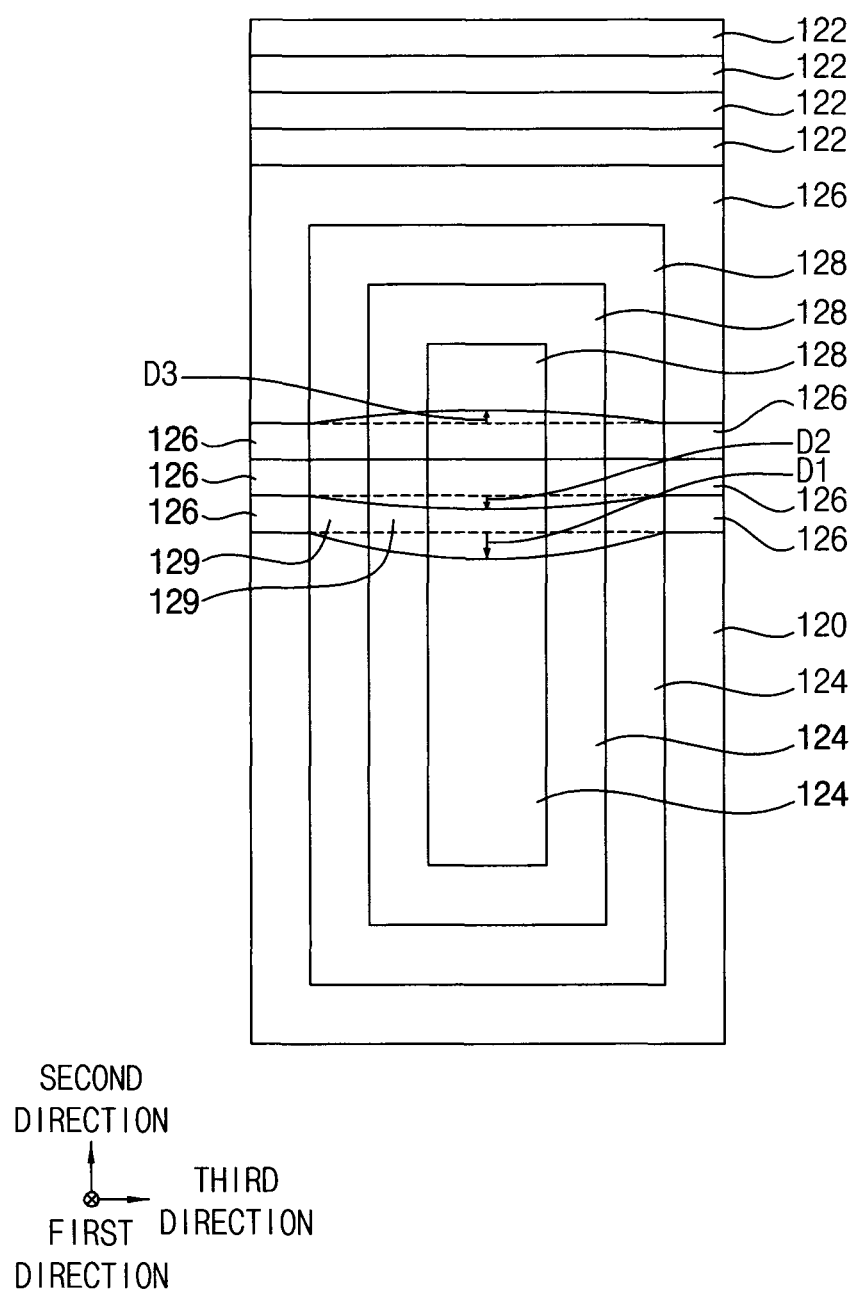

Referring to FIGS. 18 and 19, processes similar to the processes described with respect to FIGS. 16 and 17 may be performed.

For example, after reducing the area of the fourth photoresist pattern 140 to expose portions of the fourth sacrificial patterns 128, the exposed portions of the fourth sacrificial patterns 128, the fifth sacrificial patterns 129, the second and third sacrificial patterns 124 and 126, and the sacrificial layers of the 17th to 18th levels may be etched using the reduced fourth photoresist pattern 140 as an etching mask.

Accordingly, the third sacrificial patterns 126 of the 5th to 6th levels may have a length smaller than the previous one in the second direction, the third sacrificial patterns 126 of the 9th to 10th levels may have a length smaller than the previous one in the second direction, and the third sacrificial patterns 126 of the 13th to 14th levels may have a length smaller than the previous one in the second direction. The lengths of the third sacrificial patterns 126 of the 5th to 6th levels may be substantially the same as each other, the lengths of the third sacrificial patterns 126 of the 7th to 10th levels may be substantially the same as each other, and the lengths of the third sacrificial patterns 126 of the 11th to 14th levels may be substantially the same as each other. Additionally, four more third sacrificial patterns 126 may be formed at the 15th to 18th levels, respectively, to have the same length as each other and to have a length greater than those of the third sacrificial patterns 126 of the 5th to 14th levels.

Portions of the exposed fourth sacrificial patterns 128 may be moved from the 2nd to 4th levels to the 6th to 8th levels, respectively, to form the fifth sacrificial patterns 129, the fifth sacrificial patterns 129 may be moved from the 6th to 8th levels to 8th to 10th levels, respectively, and the fifth sacrificial patterns 129 of the 10th to 12th levels may be moved to the 12th to 14th levels, respectively. The portions of the second sacrificial patterns 124 not covered by the fourth photoresist pattern 140 may be moved from the 14th to 16th levels to the 16th to 18th levels, respectively.

In example embodiments, in a plan view, the fourth photoresist pattern 140 may have a bar shape extending in the third direction, however, an edge portion in the second direction of the fourth photoresist pattern 140 on the fourth sacrificial patterns 128 may have a concave curved shape in a direction toward the first region I of the substrate 100 along the second direction, e.g., in a plan view, and may not have a linear shape extending in the third direction but may have a curved shape in the third direction (e.g., a wave form as a whole in an extended stretch including multiple stair structures). In a plan view, a boundary of the edge concave portion of the fourth photoresist pattern 140 may be spaced apart from a straight line which connects edge portions of the fourth photoresist pattern 140 not formed on the fourth sacrificial patterns 128, e.g., formed on the third sacrificial patterns 126, with each other, by a maximum of a third distance D3 along the second direction. In certain example embodiments, the third distance D3 may be smaller than the second distance D2.

As described above, this is attributed to that the portion of the photoresist pattern 140 having a relatively small thickness, that is, the portion of the fourth photoresist pattern 140 on the fourth sacrificial pattern 128 of the uppermost level may be removed by a relatively large area, e.g., in a plan view, by the fourth trimming process.

Accordingly, in the fifth sacrificial patterns 129 respectively formed at the 4th to 6th levels, unlike the edge portions farther from the first region I of the substrate 100, which may have a linear shape in a plan view, the edge portions closer to the first region I of the substrate 100, which is etched by using the fourth photoresist pattern 140, may have a concave curved shape in a direction toward the first region I of the substrate along the second direction in a plan view. For example, the closer edge portions of the fifth sacrificial patterns 129 may be boundaries between the fifth sacrificial patterns 129 and the third sacrificial patterns 126 and between the fifth sacrificial patterns 129 and the fourth sacrificial patterns 128, and the boundaries may have a curved shape in a plan view. For example, the boundaries may correspond to end lines of the third sacrificial patterns 126 and edge lines of the fourth sacrificial patterns 128 in a plan view. For example, exposed portions of the end lines of the fourth sacrificial patterns 128 formed at the 2nd, 3rd and/or 4th levels may be closer to the first region I, in a plan view, than the exposed portions of the end lines of the third sacrificial pattern 126 formed at the 5th and/or 6th levels. For example, the exposed portions of the end lines of the third sacrificial patterns 126 of the 5th and 6th levels and fourth sacrificial patterns 128 of the 2nd to 4th levels may have a wave form as a whole in a plan view.

Boundaries of edge portions of the fifth sacrificial patterns 129 transferred to the 8th to 10th levels and boundaries of edge portions of the fifth sacrificial patterns 129 transferred to the 12th to 14th levels may maintain the original shapes, e.g., substantially the same shapes (e.g., the same or similar shapes) as the previous ones.

Referring to FIG. 20, the fourth photoresist pattern 140 may be removed.

Accordingly, the first sacrificial patterns 122 may be stacked to have a staircase shape at the 1st to 4th levels, the fourth sacrificial patterns 128 may be stacked to have a staircase shape spaced apart from the first sacrificial patterns 122 at the 2nd to 4th levels, the third sacrificial patterns 126 may be stacked to have a staircase shape at the 5th to 18th levels, the fifth sacrificial patterns 129 may be stacked to have a staircase shape at the 4th to 6th levels, the 8th to 10th levels and the 12th to 14th levels, and the second sacrificial patterns 124 may be stacked to have a staircase shape at the 16th to 18th levels.

In example embodiments, in a plan view, the fifth sacrificial patterns 129 of the 12th to 14th levels may have a curved shape of which a central portion may be convex in a direction away from the first region I of the substrate 100 along the second direction, not a linear shape of which each of both edges in the second direction may extend in the third direction. The curved shape of a first boundary of the fifth sacrificial patterns 129 relatively close to the first region I of the substrate 100 may be gentler than a curved shape of a second boundary of the fifth sacrificial patterns 129 relatively far from the first region I of the substrate 100.

In example embodiments, in a plan view, a second boundary of the fifth sacrificial patterns 129 of the 8th to 12th levels relatively far from the first region I of the substrate 100 may have a curved shape of which a central portion may be convex in a direction away from the first region I of the substrate 100. However, a first boundary of the fifth sacrificial patterns 129 relatively close to the first region I of the substrate 100 may have a nearly linear shape extending in the third direction.

In example embodiments, in a plan view, a second boundary of the fifth sacrificial patterns 129 of the 4th to 6th levels relatively far from the first region I of the substrate 100 may have a nearly linear shape extending in the third direction. However, a first boundary of the fifth sacrificial patterns 129 relatively close to the first region I of the substrate 100 may have a curved shape of which a central portion may be concave in a direction toward the first region I of the substrate 100 along the second direction. For example, a line formed by edges of the third sacrificial patterns 126 of the 5th and 6th levels and by edges of the fourth sacrificial patterns 128 of the 3rd and 4th levels in a plan view, may have a curved shape so that the edge portions of the fourth sacrificial patterns 128 of the line is disposed closer to the first region I than the edge portions of the third sacrificial patterns 126 of the line.

For example, by the phenomenon that a portion having a relatively small thickness is reduced by a relatively large area, e.g., in a plan view, during the trimming process for reducing the area of the fourth photoresist pattern 140, in the fourth photoresist pattern 140 covering the second sacrificial patterns 124 or the fourth sacrificial patterns 128, which may be stacked to have a staircase shape, a central portion of the fourth photoresist pattern 140 adjacent to and/or formed on the uppermost level of the second and fourth sacrificial patterns 124 and 128 may be reduced by a relatively large area, e.g., in a plan view, by repeatedly performing the trimming process.

However, in example embodiments, when the fourth photoresist pattern 140 is formed before the trimming process, the central portion thereof may have a convex shape, e.g., in a plan view, and thus, even if the central portion of the fourth photoresist pattern 140 may be removed by a relatively large area, e.g., in a plan view, through a repetitive trimming process, the central portion of the fifth sacrificial patterns 129 finally formed may not have an excessively concave shape.

Figure 23:
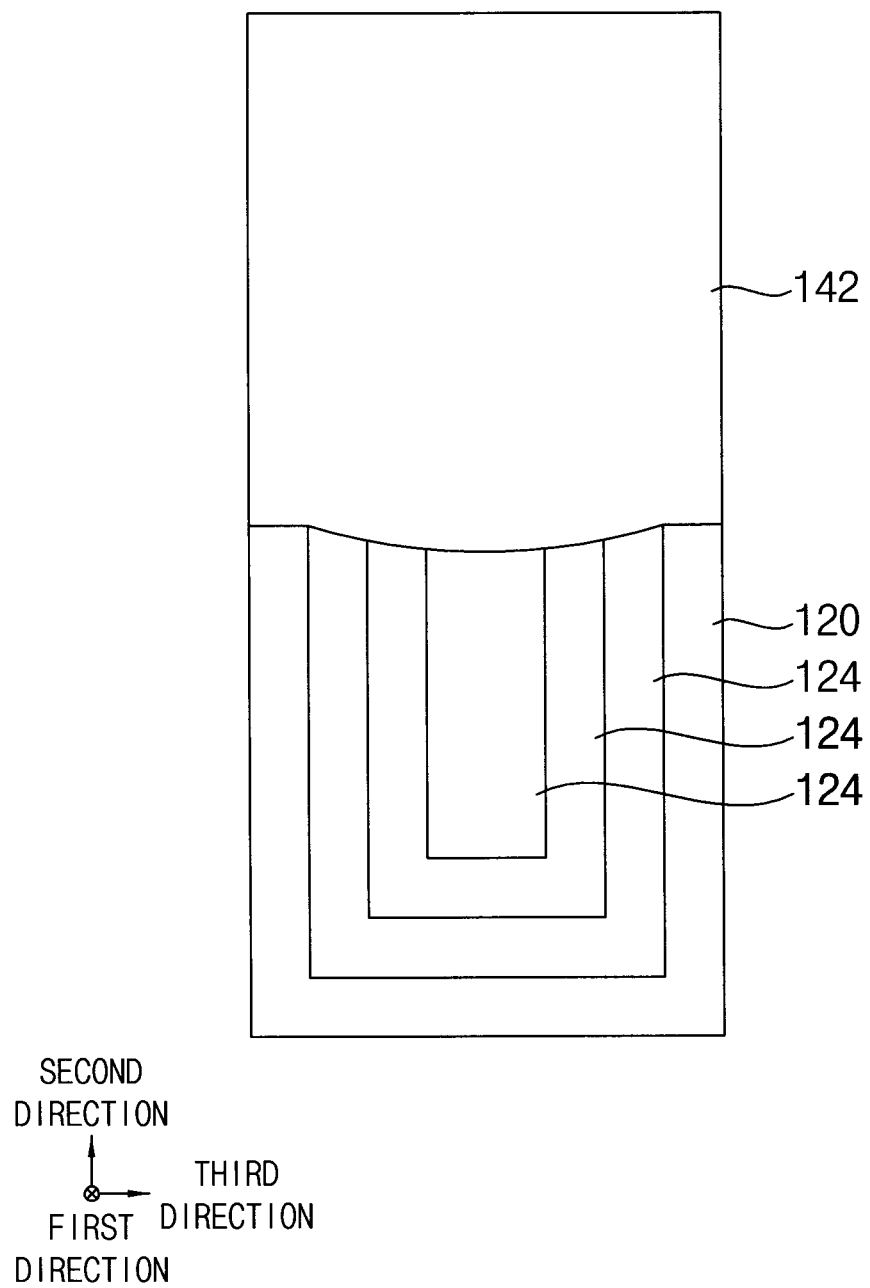

Referring to FIGS. 22 and 23, a fifth photoresist pattern 142 may be formed on the sacrificial layer 120 of the 19th level to cover the first sacrificial patterns 122, the third to fifth sacrificial patterns 126, 128 and 129, and portions of the second sacrificial patterns 124 adjacent to the fifth sacrificial patterns 129 in a plan view, and the second sacrificial patterns 124 and the sacrificial layers 120 of the 19th to 22nd levels may be etched using the fifth photoresist pattern 142 as an etching mask.

In example embodiments, in a plan view, the fifth photoresist pattern 142 may have a bar shape extending in the third direction as a whole, however, an edge portion of the fifth photoresist pattern 142 in the second direction on the second sacrificial patterns 124, e.g., a portion sharing a boundary with the second sacrificial patterns 124, may have a convex curved shape in a direction away from the first region I of the substrate 100 along the second direction, not a linear shape extending in the third direction. For example, the portion of the fifth photoresist pattern 142 sharing a boundary with the second sacrificial patterns 124 may have a wave shape as a whole in a plan view. For example, the portion of the fifth photoresist pattern 142 formed on the uppermost layer of the second sacrificial patterns 124 may protrude from the other portions in the second direction.

Accordingly, edge portions of the fourth sacrificial patterns 128 remaining on the third sacrificial pattern 126 of the 19th level after being etched by using the fifth photoresist pattern 142, may also have a convex curved shape in the second direction.

Figure 26:
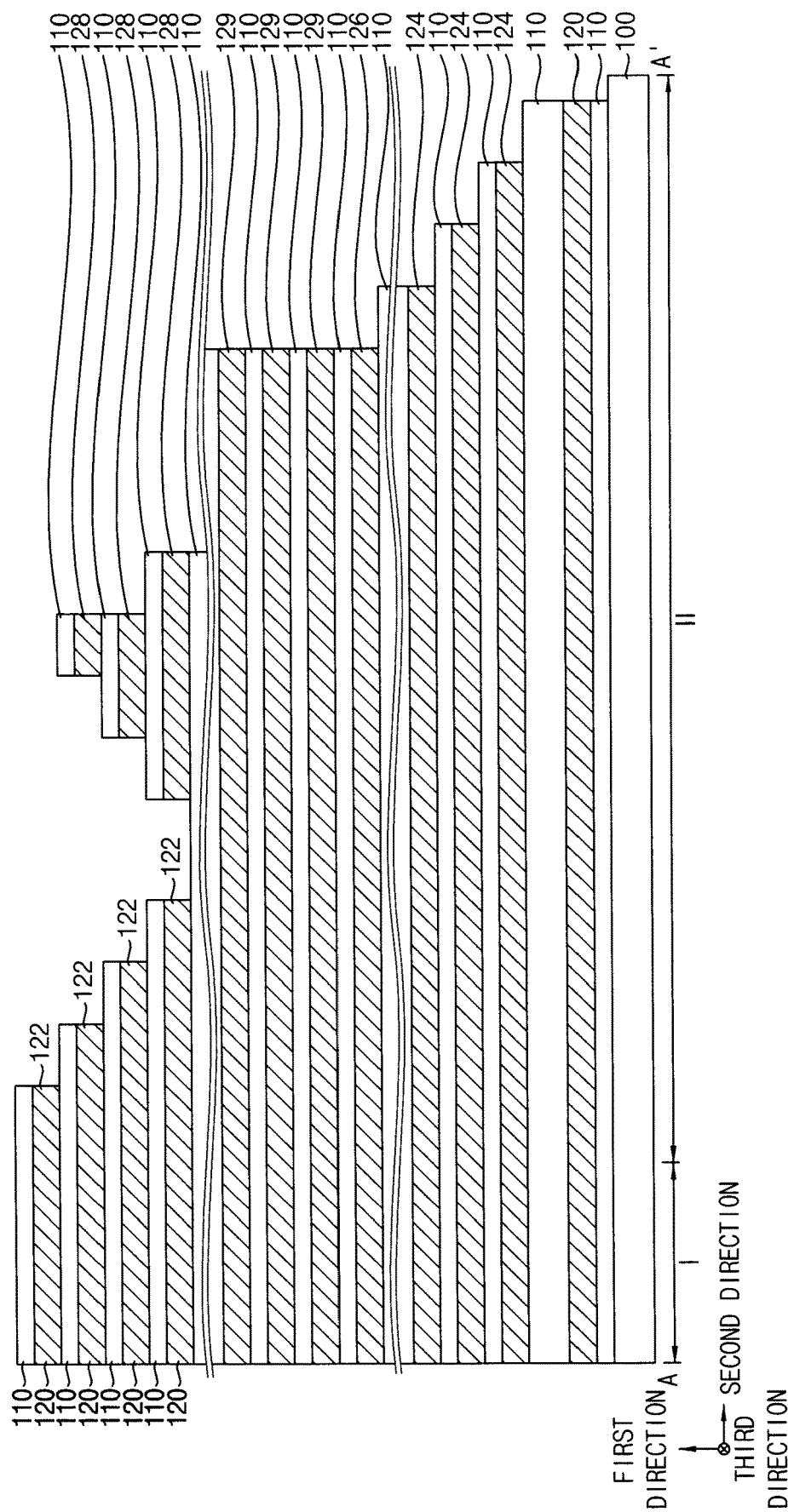

Referring to FIGS. 24 to 26, additional processes substantially the same as or similar to the processes described with respect to FIGS. 12 to 21 may be performed.

Accordingly, more fifth sacrificial patterns 129 may be formed between the fifth sacrificial patterns 129 previously formed and the second sacrificial patterns 124, and the shapes of the fifth sacrificial patterns 129 may be similar to those of the fifth sacrificial patterns 129 previously formed. For example, the curved shape of the end lines of the third sacrificial patterns 126 and the fifth sacrificial patterns 129 may vary in their curvatures according to their levels.

After removing the fifth photoresist pattern 142, the formation of the photoresist pattern, the trimming process and the etching process may be repeatedly performed, so that the fifth sacrificial patterns 129 may be additionally formed at the desired number of levels between the fourth sacrificial patterns 128 and the second sacrificial patterns 124, e.g., in a plan view and/or a perspective view. The number of times of the trimming process and the etching process per each photoresist pattern, and the number of the photoresist pattern to be formed may vary and may not be limited to certain number.

Each of opposite first and second boundaries in the second direction of the fifth sacrificial patterns 129, which may be etched using the photoresist pattern as an etching mask at first, may have a convex curved shape in a direction away from the first region I of the substrate 100 in a plan view. The curved shape of the first boundary of the fifth sacrificial patterns 129 relatively close to the first region I of the substrate 100 may be gentler than that of the second boundary the fifth sacrificial patterns 129 relatively far from the first region I of the substrate 100. The curved shape of each of the opposite boundaries in the second direction of the fifth sacrificial patterns 129, which may be formed by repeatedly performing the trimming process and the etching process, may be gradually gentler, and each of the opposite boundaries of the fifth sacrificial patterns 129 of a given level or a higher level may have a concave curved shape in a direction toward the first region I of the substrate 100. For example, end portions of the boundaries of the fifth sacrificial patterns 129 may be further away from the first region I than the central portions of the boundaries of the fifth sacrificial patterns 129.

By performing the processes described above, the first to fifth sacrificial patterns 122, 124, 126, 128 and 129 may be formed on the second region II of the substrate 100, and may form a mold together with the sacrificial layers 120 remaining on the first region I of the substrate 100. Each of the first sacrificial patterns 122, the second sacrificial patterns 124, the third sacrificial patterns 126, the fourth sacrificial patterns 128 and the fifth sacrificial patterns 129 may be stacked to have a staircase shape of which a length in the second direction may be gradually reduced toward the uppermost level.

Figure 27:
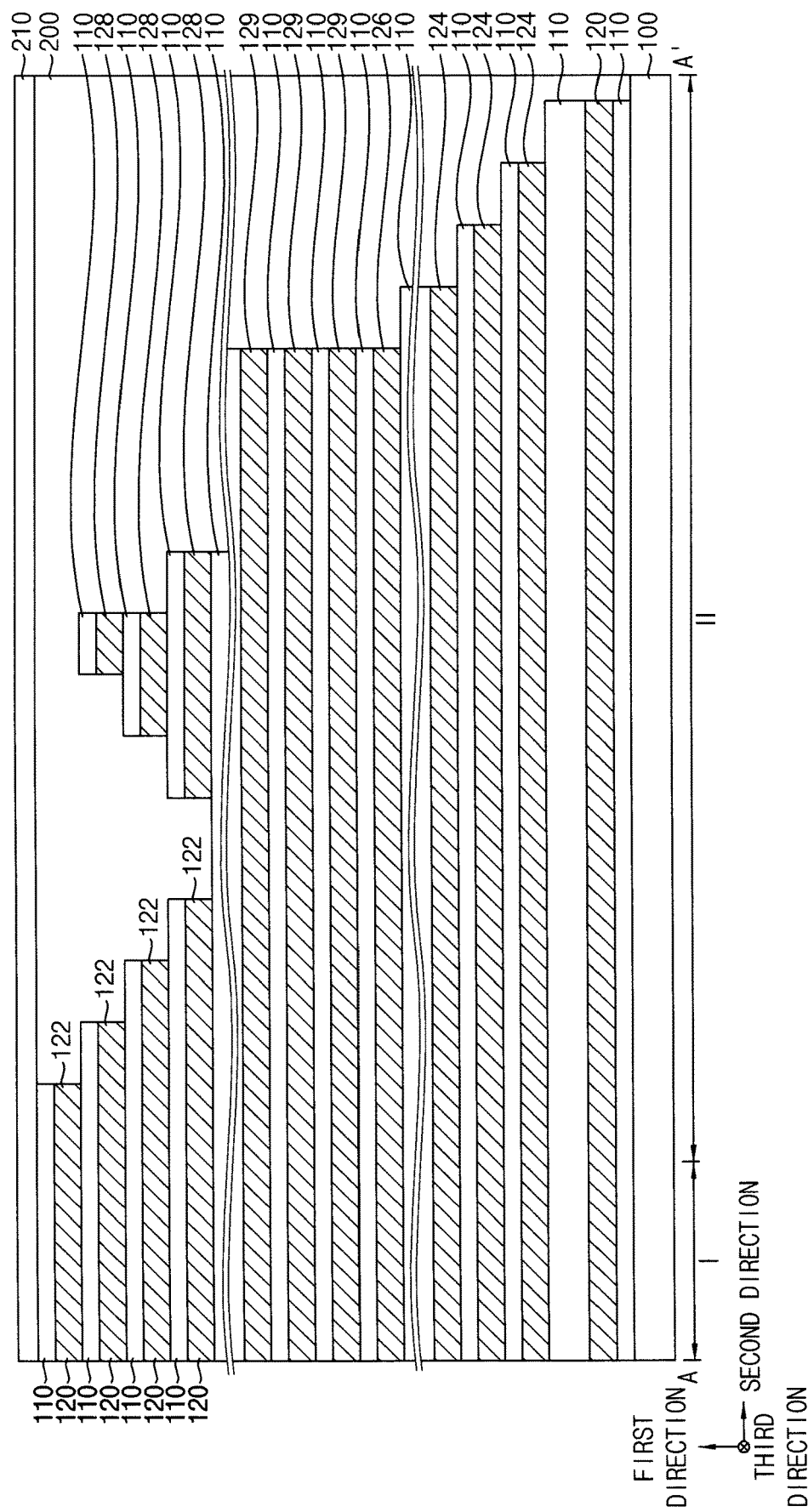

Referring to FIG. 27, a first insulating interlayer 200 may be formed on the substrate 100 to cover the mold, and may be planarized until an upper surface of the insulation layer 110 of the uppermost level may be exposed. Accordingly, the first insulating interlayer 200 may cover a sidewall of the mold.

The planarization process may be performed by a chemical mechanical polishing (CMP) process and/or an etch back process.

A second insulating interlayer 210 may be formed on an upper surface of the mold and an upper surface of the first insulating interlayer 200. The first and second insulating interlayers 200 and 210 may include an oxide, e.g., silicon oxide, and may be merged with the insulation layer 110 or with each other.

Figure 28:
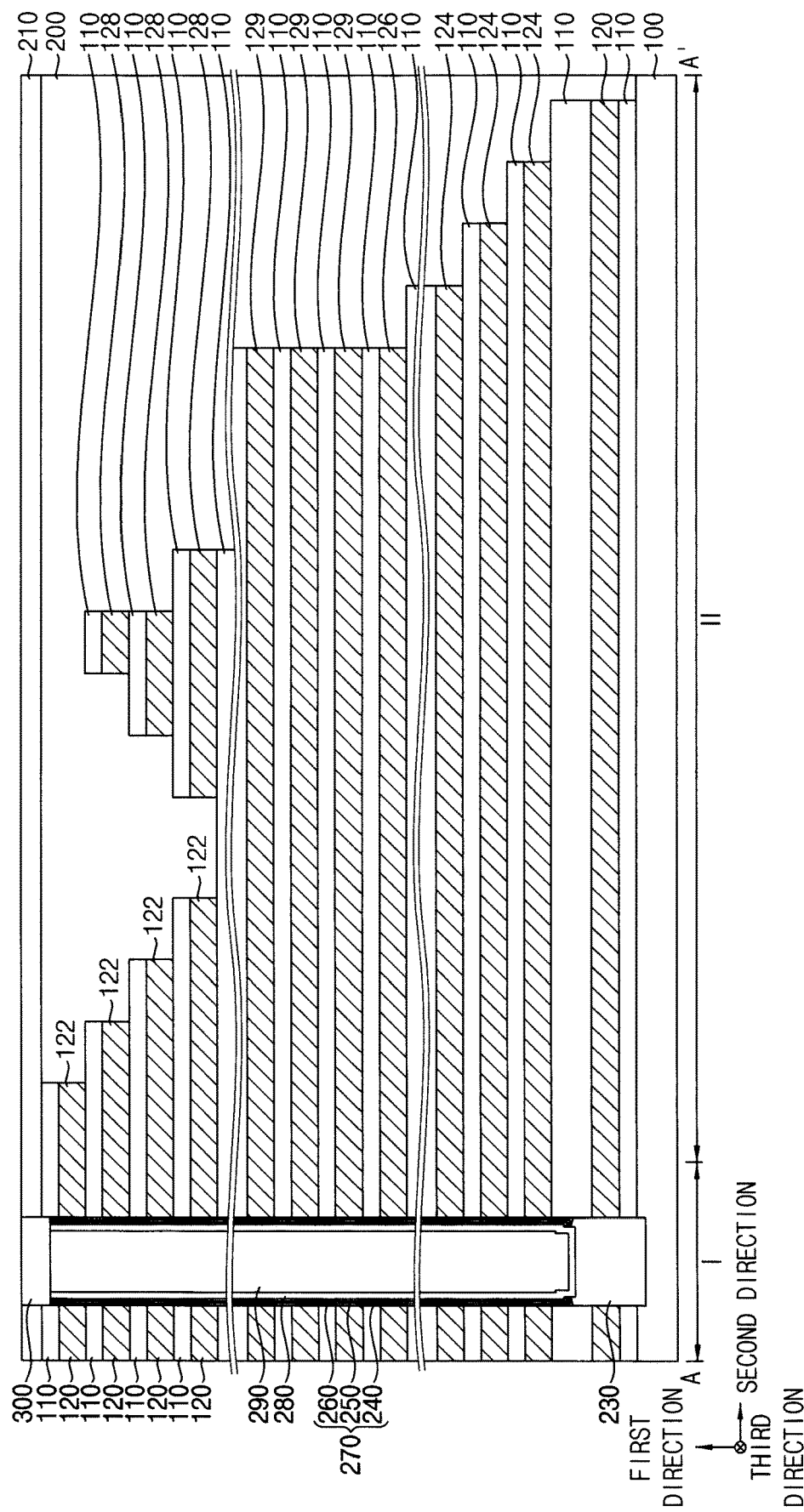

Referring to FIG. 28, after forming a first mask (not shown) on the second insulating interlayer 210, the second insulating interlayer 210, the insulation layers 110 and the sacrificial layers 120 thereunder may be etched using the first mask as an etching mask to form a channel hole extending therethrough to partially expose an upper surface of the first region I of the substrate 100. Thereafter, a second structure filling the channel hole may be formed as follows.

After removing the first mask, a semiconductor pattern 230 may be formed to partially fill the channel hole.

For example, a selective epitaxial growth (SEG) process may be performed using the upper surface of the substrate 100 exposed by the channel hole as a seed to form the semiconductor pattern 230 partially filling the channel hole. In example embodiments, an upper surface of the semiconductor pattern 230 may be situated between an upper surface and a lower surface of the insulation layer 110 of the 2nd level from the upper surface of the substrate 100 in the first direction.

A first blocking layer, a charge storage layer, a tunnel insulation layer and a first spacer layer (not shown) may be sequentially formed on sidewalls of the channel holes, the upper surface of the semiconductor pattern 230 and an upper surface of the second insulating interlayer 210, the spacer layer may be anisotropically etched to form a first spacer remaining only on the sidewalls of the channel holes, and the tunnel insulation layer, the charge storage layer and the first blocking layer may be etched using the first spacer as an etching mask to form a tunnel insulation pattern 260, a charge storage pattern 250 and a first blocking pattern 240, respectively, on the semiconductor pattern 230 and the sidewalls of the channel holes to have a cup shape of which a central lower portion may be opened. During the etching process, an upper portion of the semiconductor pattern 230 may be also partially removed. The tunnel insulation pattern 260, the charge storage pattern 250 and the first blocking pattern 240 may form a charge storage structure 270.

The first spacer layer and the charge storage pattern 250 may include a nitride, e.g., silicon nitride, and the tunnel insulation pattern 260 and the first blocking pattern 240 may include an oxide, e.g., silicon oxide.

After removing the first spacer, a channel layer may be formed on the exposed semiconductor pattern 230, the tunnel insulation pattern 260 and the second insulating interlayer 210, and a filling layer may be formed on the channel layer to sufficiently fill remaining portions of the channel holes. The filling layer and the channel layer may be planarized until the upper surface of the second insulating interlayer 210 may be exposed so that a filling pattern 290 may be formed to fill the remaining portion of each of the channel holes, and the channel layer may be transformed into a channel 280.

In example embodiments, a plurality of channels 280 may be formed in each of the second and third directions to form a channel block and a channel array.

An upper portion of a first structure including the filling pattern 290, the channel 280 and the charge storage structure 270 may be removed to form a trench, and a capping pattern 300 may be formed to fill the trench.

Each of the channel 280 and the capping pattern 300 may include doped or undoped single crystalline silicon or polysilicon.

Figure 29:
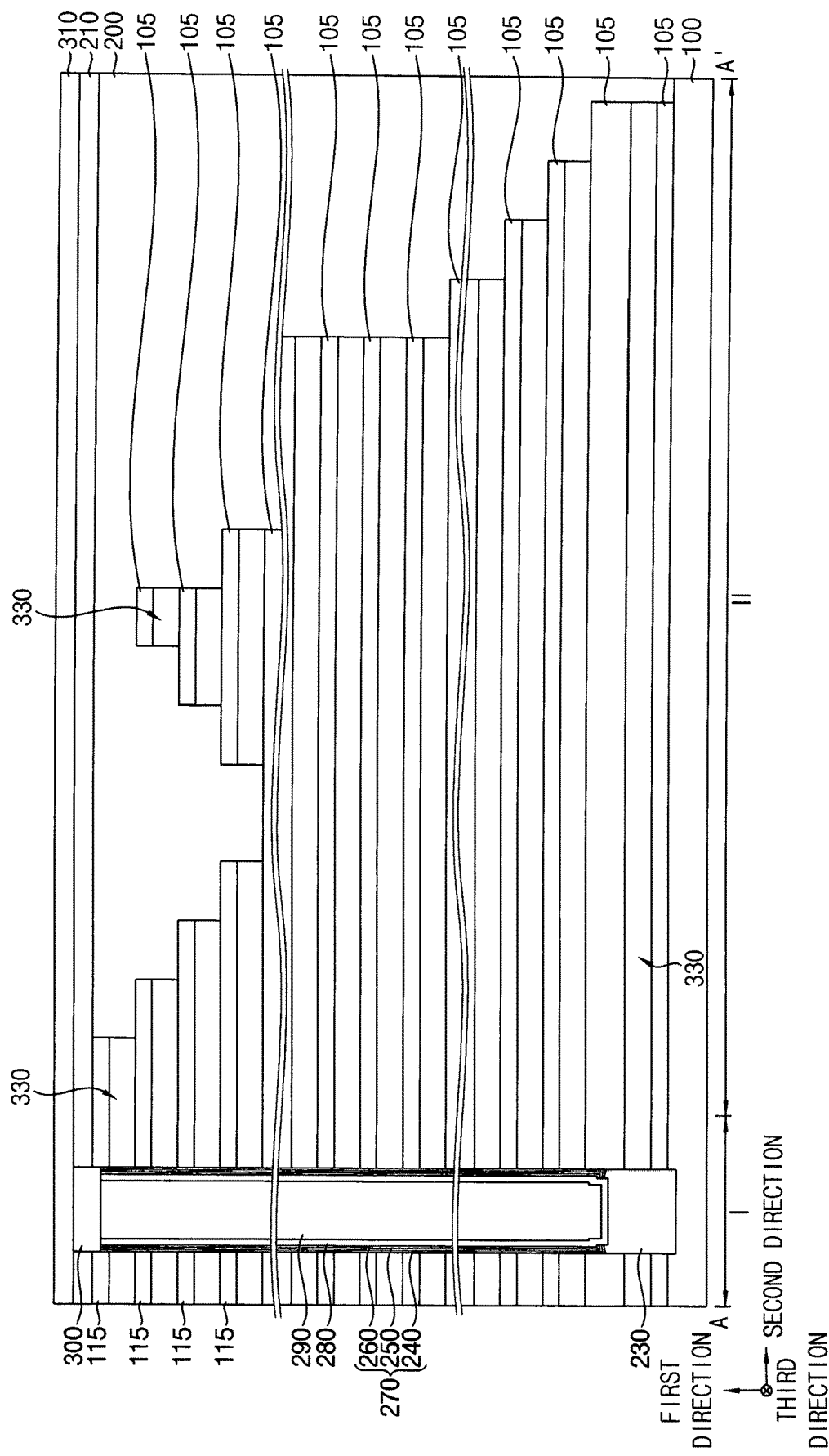
Figure 30:
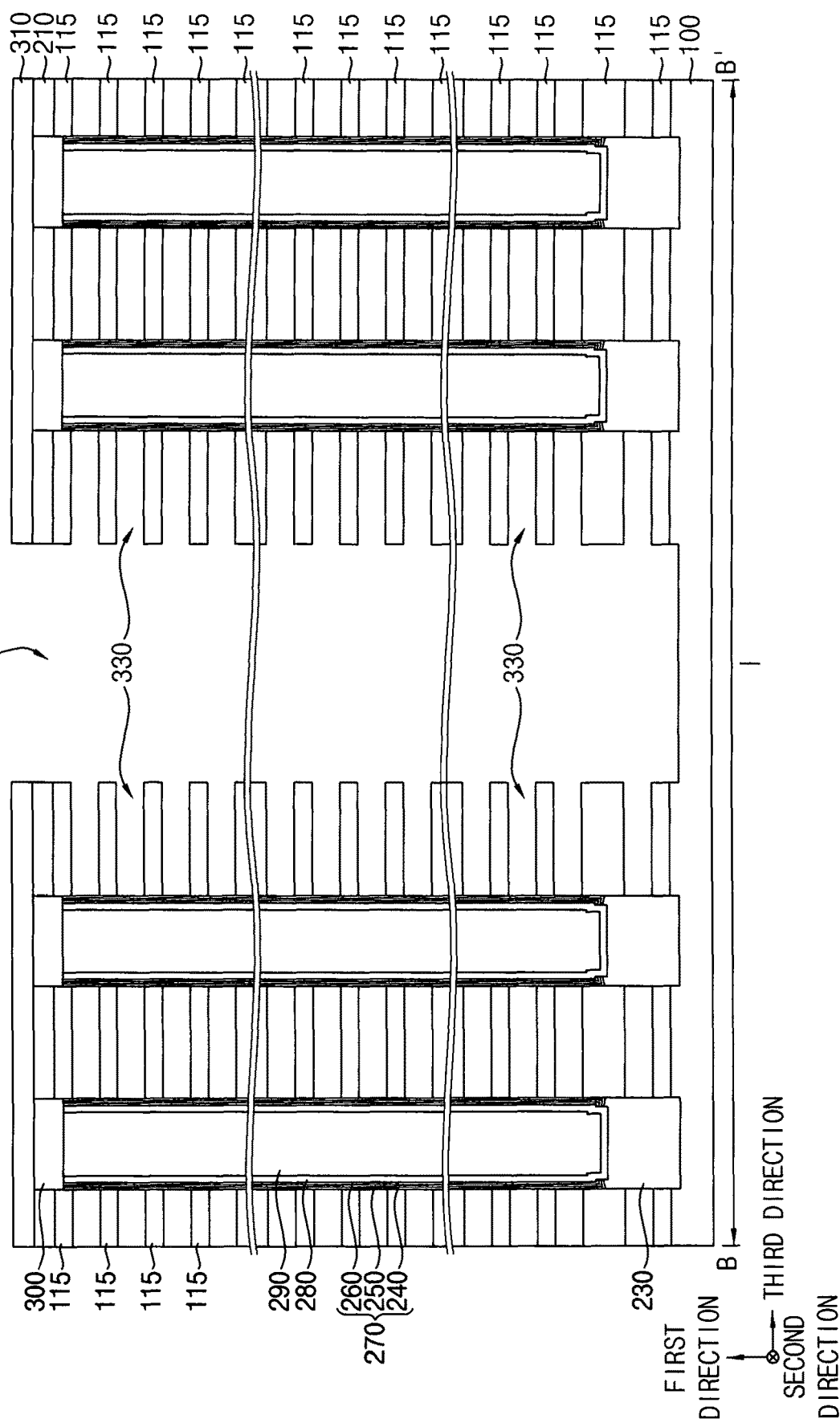

Referring to FIGS. 29 and 30, a third insulating interlayer 310 may be formed on the second insulating interlayer 210 and the capping pattern 300, a second mask (not shown) may be formed on the third insulating interlayer 310, and an opening 320 may be formed through the second and third insulating interlayers 210 and 310, the insulation layers 110, the sacrificial layers 120 and the first to fifth sacrificial patterns 122, 124, 126, 128 and 129 thereunder to expose the upper surface of the substrate 100.

In example embodiments, the opening 320 may extend in the second direction on the first and second regions I and II of the substrate 100, and a plurality of openings 320 may be formed in the third direction. As the openings 320 are formed, the insulation layer 110 may be transformed into insulation patterns 115.

After removing the second mask, the sacrificial layers 120 and the first to fifth sacrificial patterns 122, 124, 126, 128 and 129 exposed by the opening 320 may be removed to form a gap 330 between the insulation patterns 115 of neighboring levels, and a portion of an outer sidewall of the first blocking pattern 240 and a portion of a sidewall of the semiconductor pattern 230 may be exposed by the gap 330.

Figure 31:
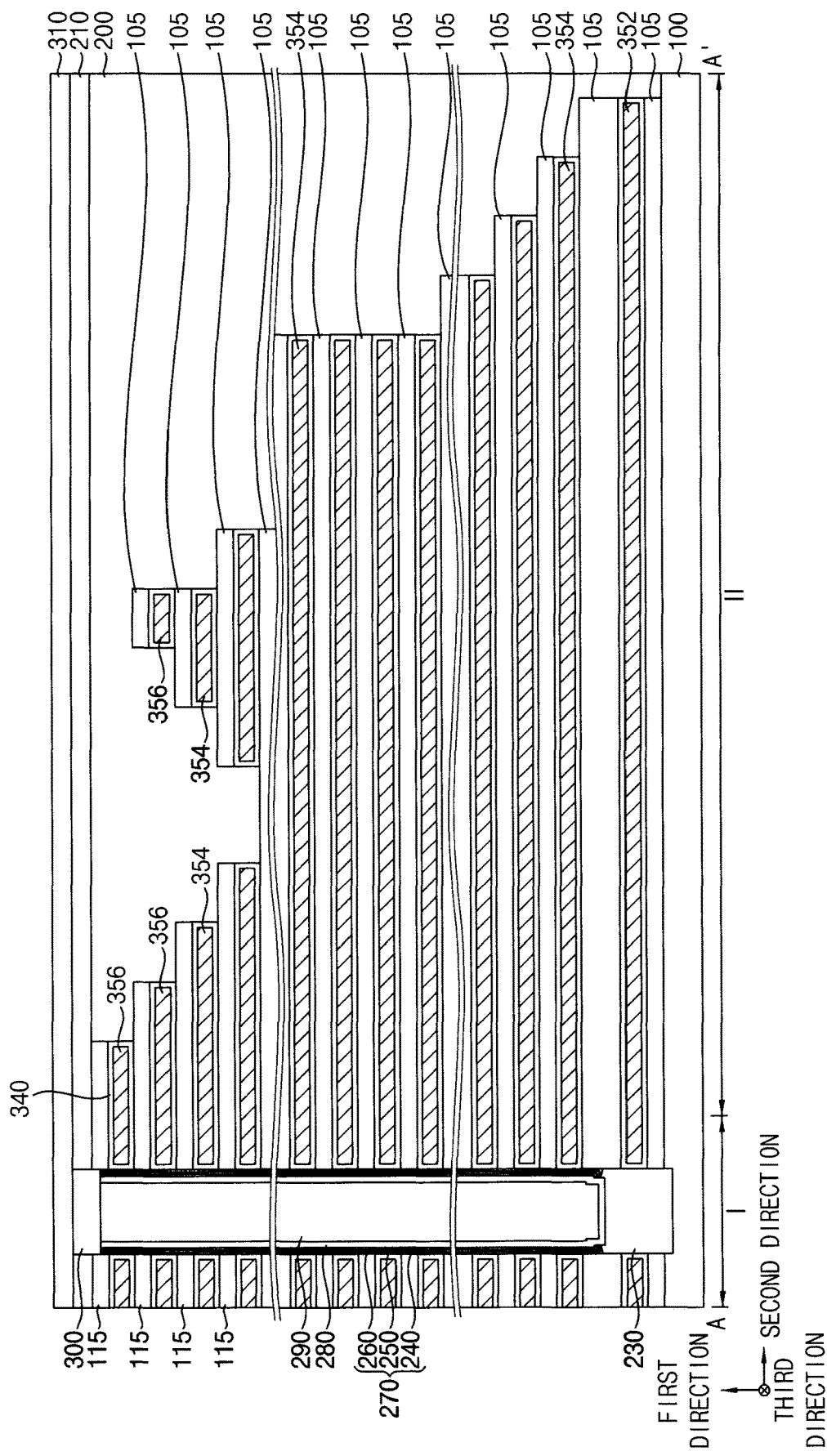
Figure 32:
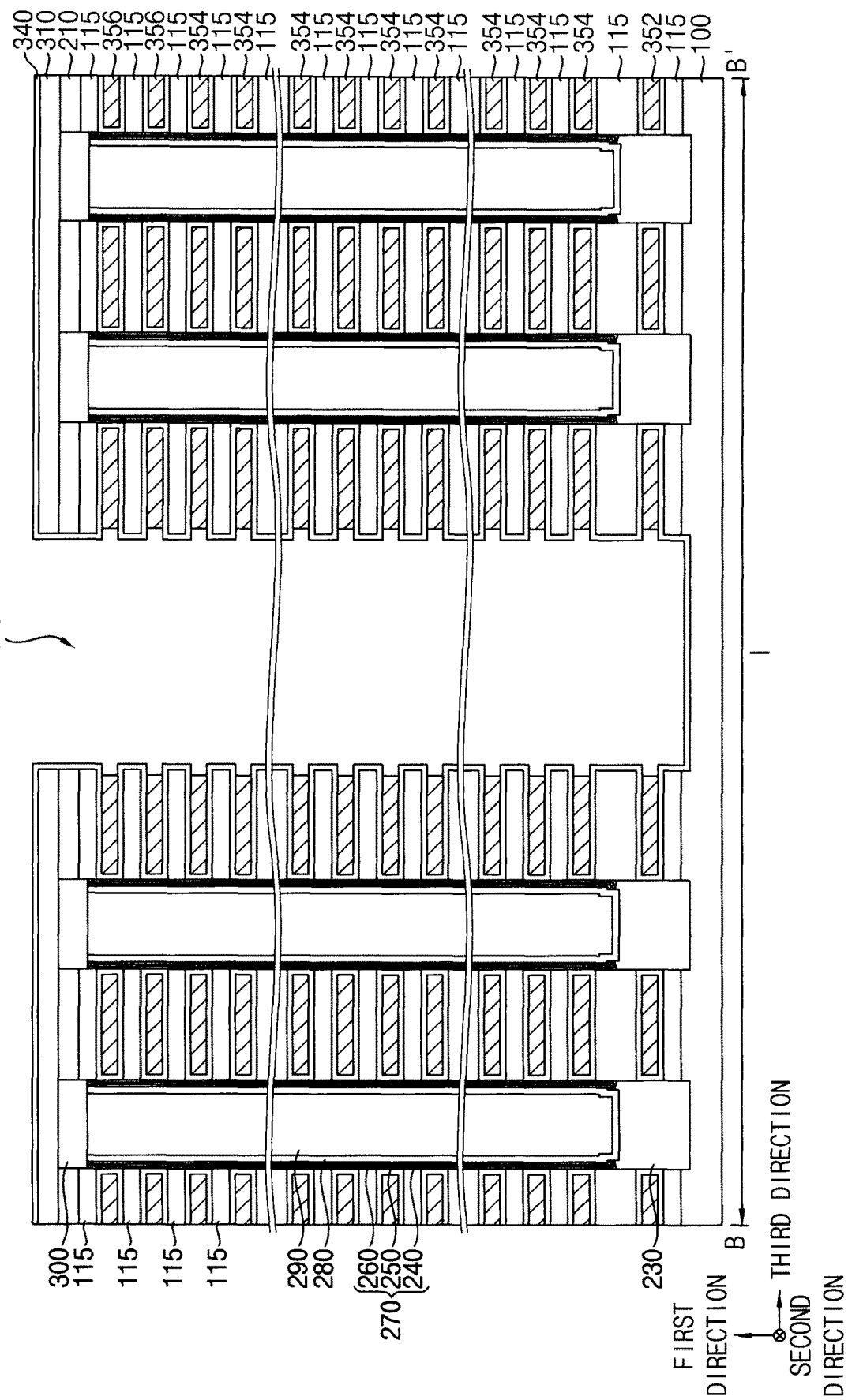
Figure 33:
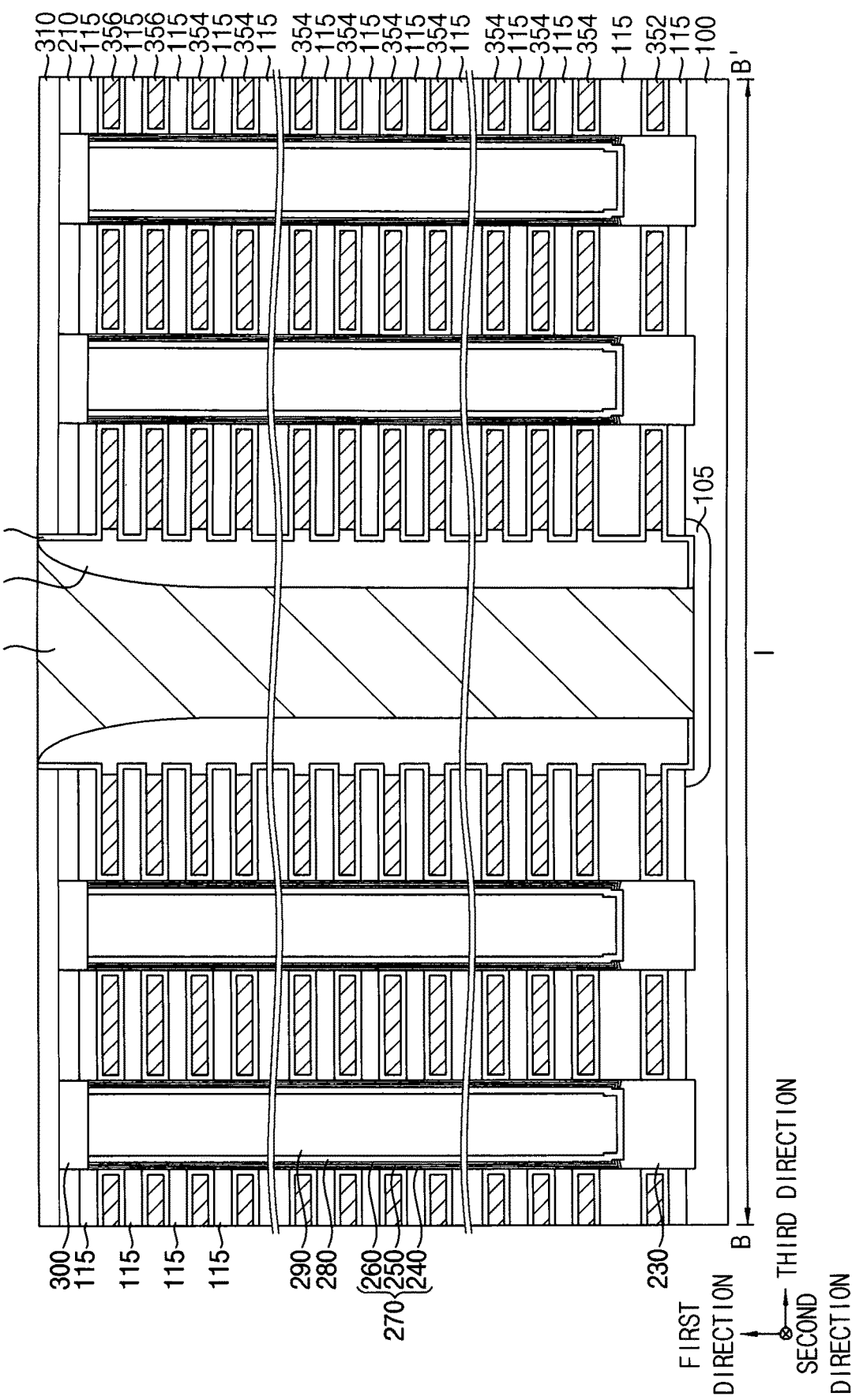

Referring to FIGS. 31 and 32, a second blocking layer 340 may be formed on the exposed outer sidewall of the first blocking pattern 240, the exposed sidewall of the semiconductor pattern 230, an inner wall of the gap 330, surfaces of the insulation patterns 115, the exposed upper surface of the substrate 100 and an upper surface of the third insulating interlayer 310, and a gate conductive layer may be formed on the second blocking layer 340 to sufficiently fill a remaining portion of the gap 330. A gate barrier layer (not shown) may be further formed between the second blocking layer 340 and the gate conductive layer.

The second blocking layer 340 may include a metal oxide, e.g., aluminum oxide, the gate conductive layer may include a low resistant metal, e.g., tungsten, aluminum, etc., and the gate barrier layer may include a metal nitride, e.g., titanium nitride, tantalum nitride, etc.

The gate conductive layer may be partially removed to form a gate conductive pattern in the gap 330, and if the gate barrier layer is formed, the gate barrier layer may be also removed to form a gate barrier pattern. The gate conductive pattern and the gate barrier pattern altogether may form a gate electrode.

In example embodiments, the gate electrode may extend in the second direction, and a plurality of gate electrodes may be formed in the third direction. For example, the gate electrodes each of which may extend in the second direction may be spaced apart from each other in the third direction by a plurality of openings 320.

The gate electrodes may be stacked at a plurality of levels to be spaced apart from each other in the first direction, and each of the gate electrodes may extend in the second direction on the first and second regions I and II of the substrate 100.

An end portion in the second direction of each of the gate electrodes may be referred to as a pad, and contact plugs may be subsequently formed to contact an upper surface of the pad.

The gate electrodes that may be formed by replacement of the sacrificial layers 120 and the first sacrificial patterns 122 connected thereto may have lengths in the second direction gradually reduced toward the uppermost level similarly to the first sacrificial patterns 122 described above, and may include the pads stacked to have a staircase shape on the second region II adjacent to the first region I of the substrate 100.

The gate electrodes formed by replacement of the sacrificial layers 120 and the second sacrificial patterns 124 connected thereto may have lengths in the second direction gradually reduced toward the uppermost level similarly to the second sacrificial patterns 124 described above, and may include the pads stacked to have a staircase shape on the second region II far from the first region I of the substrate 100.

The gate electrodes formed by replacement of the fourth sacrificial patterns 128 may have lengths in the second direction gradually reduced toward the uppermost level similarly to the fourth sacrificial patterns 128 described above, and may include the pads stacked to have a staircase shape on a central portion of the second region II spaced apart from the first region I of the substrate 100.

The gate electrodes formed by replacement of the sacrificial layers 120 and the third and fifth sacrificial patterns 126 and 129 connected thereto may have the same length in the second direction within a unit group including a plurality of levels, and may have a length gradually reduced toward the uppermost level among a plurality of groups stacked in the first direction similarly to the third and fifth sacrificial patterns 126 and 129 described above. Each of portions of the gate electrodes formed by replacement of the fifth sacrificial patterns 129 within the unit group and end portions in the second direction of the gate electrodes formed by replacement of the third sacrificial patterns 126 thereunder may form the pads.

For example, the pads within the unit group may be arranged to have a staircase shape in the third direction, and a plurality of unit groups may be stacked to have a staircase shape as a whole in the second direction.

The gate electrodes may include the first to third gate electrodes 352, 354 and 356 sequentially stacked in the first direction. In example embodiments, the first gate electrode 352 may be formed at the lowermost level, the third gate electrode 356 may be formed at the uppermost level and one level thereunder, e.g., at the 1st and 2nd levels, and the second gate electrode 354 may be formed at a plurality of levels between the first gate electrode 352 and the third gate electrode 356.

Referring to FIG. 33, impurities may be implanted into an upper portion of the substrate 100 exposed by the opening 320 to form an impurity region 105.

After forming a second spacer layer on the upper surface of the substrate 100 exposed by the opening 320, a sidewall of the opening 320 and the upper surface of the third insulating interlayer 310, the second spacer layer may be anisotropically etched to form a second spacer 400 on each of the sidewall of the opening 320.

A common source line (CSL) 410 may be formed on the impurity region 105 to fill a remaining portion of the opening 320.

In example embodiments, after forming a first conductive layer on the exposed upper surface of the impurity region 105, the second spacer 400 and the third insulating interlayer 310 to fill the opening 320, an upper portion of the first conductive layer may be planarized until the upper surface of the third insulating interlayer 310 may be exposed to form the CSL 410. During the planarization process, a portion of the second blocking layer 340 on the upper surface of the third insulating interlayer 310 may be also removed. The CSL 410 may be formed in the opening 320 to contact the upper surface of the impurity region 105.

By the CSL 410 and the second spacer 400 filling the opening 320 extending in the second direction, each of the first to third gate electrodes 352, 354 and 356 may be separated from each other in the third direction.

Figure 34:
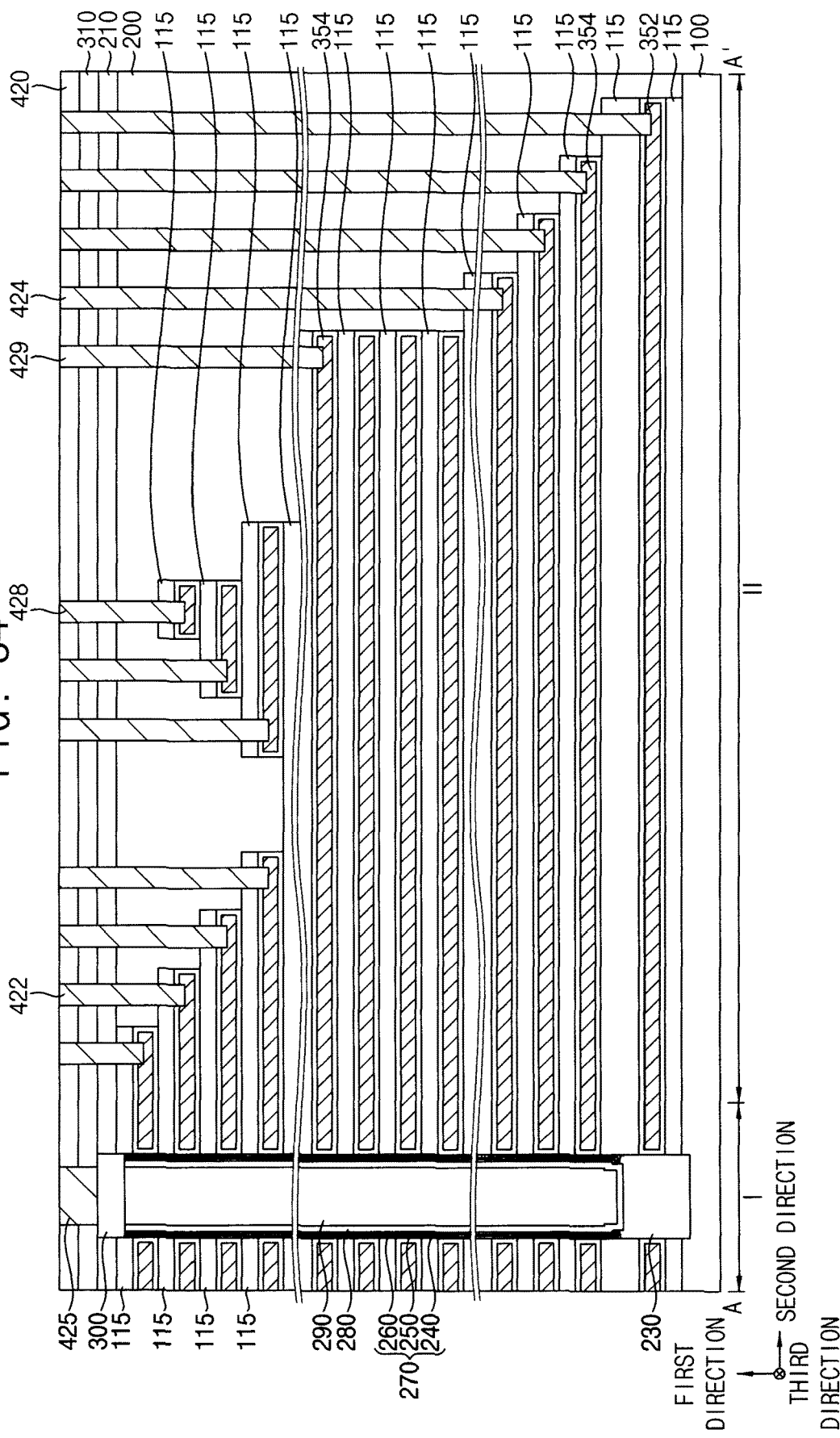
Figure 35:
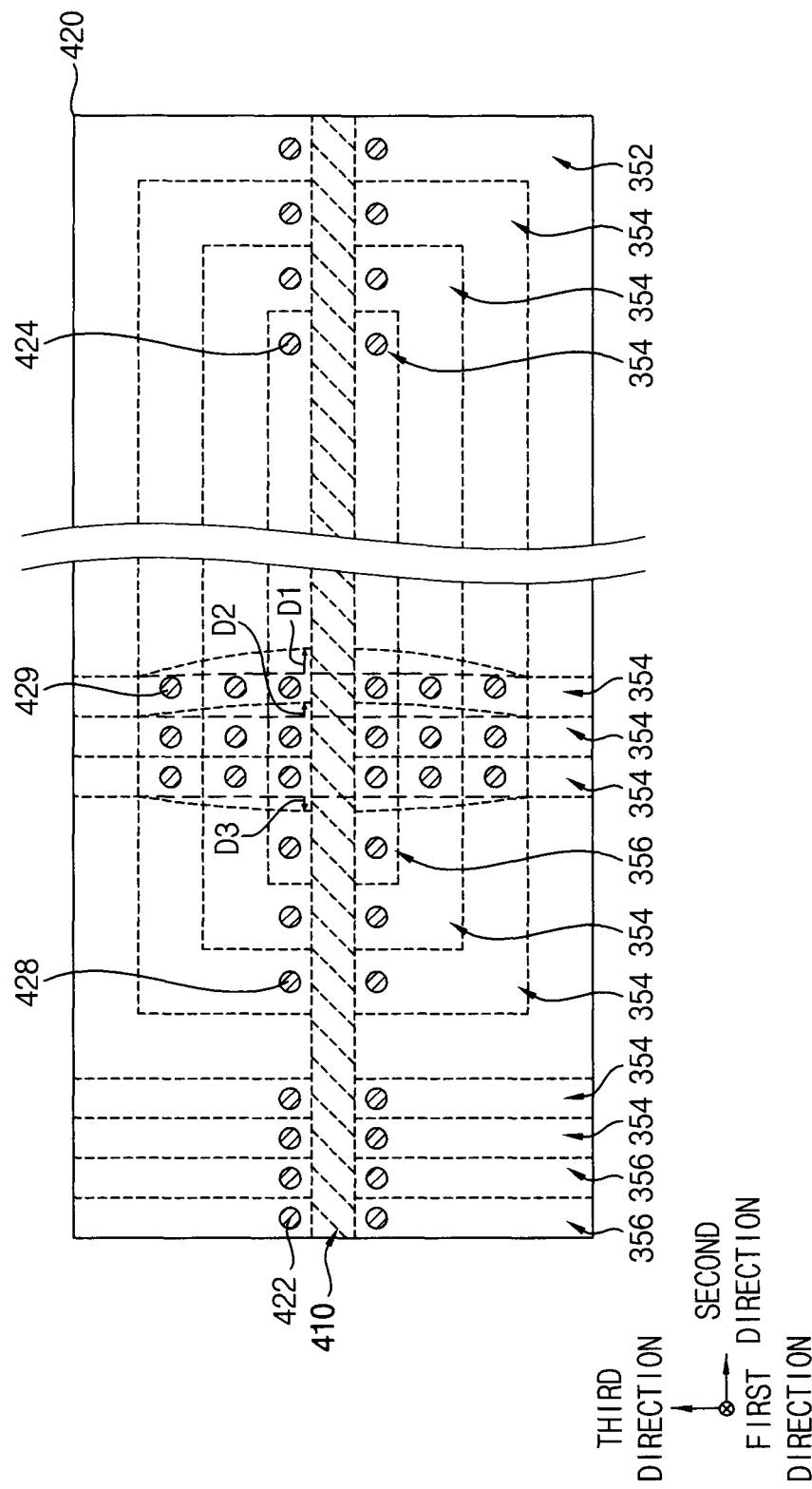

Referring to FIGS. 34 and 35, after forming a fourth insulating interlayer 420 on the third insulating interlayer 310, the CSL 410, the second spacer 400 and the second blocking layer 340, first to fourth contact plugs 422, 424, 428 and 429 may be formed through the first to fourth insulating interlayers 200, 210, 310 and 420, the insulation patterns 115 and the second blocking layer 340 to contact the upper surface of the pad of one of the first to third gate electrodes 352, 354 and 356, and a fifth contact plug 425 may be formed through the third and fourth insulating interlayers 310 and 420 to contact an upper surface of the capping pattern 300.

The first to fourth contact plugs 422, 424, 428 and 429 may be formed by forming first to fourth contact holes through the first to fourth insulating interlayers 200, 210, 310 and 420, the insulation patterns 115 and the second blocking layer 340 to expose the upper surface of the pad of one of the first to third gate electrodes 352, 354 and 356, forming a second conductive layer to fill the first to fourth contact holes, and planarizing the second conductive layer until an upper surface of the fourth insulating interlayer 420 may be exposed. The first to fourth contact plugs 422, 424, 428 and 429 are formed to contact the upper surfaces of the pads of the gate electrodes, which may be formed by replacements of the first, second, fourth and fifth sacrificial patterns 122, 124, 128 and 129, respectively.

In example embodiments, in a plan view, an edge portion in the second direction of each of the pads formed by replacement of the fifth sacrificial patterns 129 may have a convex curved shape in a direction away from the first region I or may have a concave curved shape in a direction toward the first region I of the substrate 100, and an edge portion thereof may have a linear shape extending in the third direction.

The shape of the pads and the fourth contact plugs 429 contacting the upper surfaces of the pads may be described in detail with reference to FIG. 36.

Figure 36:
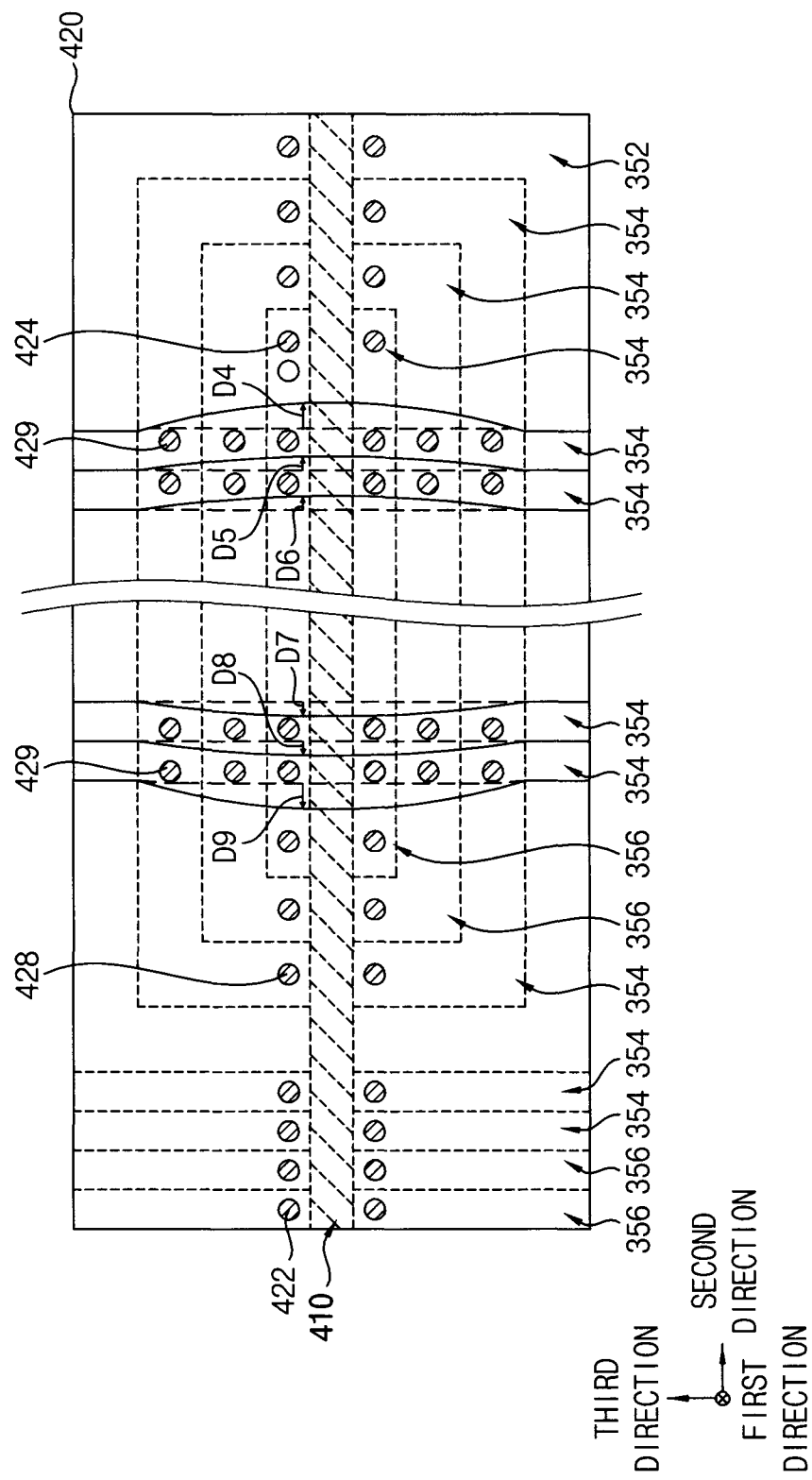

Referring to FIG. 36, for example, the fourth contact plugs 429 may include first to third groups, each of which may include pads having a staircase shape in the third direction, and the first to third groups may be sequentially stacked in the first direction (e.g., the first group being at the bottom and the third group being at the top), when edge portions and/or end lines in the second direction of the pads in each of the first to third groups include convex portions in a plan view, the curved shape (e.g., end lines) of the pads in the second group may have a slope/curve gentler (e.g., a lesser curvature) than the curved shape (e.g., end lines) of the pads in the first group, and the curved shape (e.g., end lines) of the pads in the third group may have a slope/curve gentler (e.g., a lesser curvature) than the curved shape (e.g., end lines) of the pads in the second group. For example, the maximum distances from imaginary extension lines of flat portions of the pads of the lowermost level to the boundaries of the edge convex portions (e.g., peak of the curves) in the respective first to third groups may have fourth, fifth and sixth distances D4, D5 and D6, respectively, which may have large value in this order. For example, D4 may be greater than D5, and D5 may be greater than D6.

For example, the fourth contact plugs 429 may include fourth to sixth groups, each of which may include pads having a staircase shape in the third direction, and the fourth to sixth groups may be sequentially stacked in the first direction (e.g., the fourth group being at the bottom and the sixth group being at the top), when edge portions and/or end lines in the second direction of the pads in each of the fourth to sixth groups include concave portions in a plan view, the curved shape (e.g. end lines) of the pads in the fifth group may have a slope/curve steeper (e.g., a greater curvature) than the curved shape (e.g., end lines) of the pads in the fourth group, and the curved shape (e.g., end lines) of the pads in the sixth group may have a slope/curve steeper (e.g., a greater curvature) than the curved shape (e.g., end lines) of the pads in the fifth group. For example, the maximum distances from imaginary extension lines of flat portions of the pads of the lowermost level to the boundaries of the edge concave portions (e.g., the deepest recess portions) in the respective fourth to sixth groups may have seventh, eighth, and ninth distances D7, D8 and D9, respectively, which may have a small value in this order. For example, D7 may be lesser than D8, and D8 may be lesser than D9.

In the pads in a group between the third and fourth groups, edge portions may include neither convex portion nor concave portion, but may include a linear shape (e.g., a straight line) extending in the third direction. For example, end lines of a group disposed between a group having a concave edge (e.g., a recessed end line) and another group having a convex edge (e.g., a protruding end line) may be a straight line or a substantially straight line extending to the third direction.

As described above, for example, when a staircase structure such as the second sacrificial patterns 124 or the fourth sacrificial patterns 128 is formed under the photoresist pattern, the photoresist pattern may have different thicknesses depending on the positions thereof. When a trimming process is performed on the photoresist pattern, due to the characteristics of the trimming process, a portion having a relatively small thickness may be removed by a relatively large amount/area in a plan view than a portion having a relatively great thickness, so that the photoresist pattern may have a concave shape in a plan view.

For example, when a trimming process is performed on each of the fourth and fifth photoresist patterns 140 and 142, a portion thereof on the second sacrificial patterns 124 or the fourth sacrificial patterns 128 having a staircase structure including steps at a plurality of levels may be removed by a relatively large amount/area in a plan view than other portions thereof, which may be proportional to the number and/or thicknesses of steps of the staircase structure. As a result, after the trimming process, the edge portion in the second direction of each of the fourth and fifth photoresist patterns 140 and 142 may be modified to include a concave portion having a concave curved shape in an end line toward the first region I of the substrate 100.

In the inventive concepts, considering the above characteristics of the trimming process, when the photoresist pattern is formed, a portion thereof on the staircase structure may include a convex portion having a convex curved shape in a direction away from the first region I of the substrate 100. Accordingly, when the trimming process is repeatedly performed, the convex portion may be removed by a relatively large amount/area in a plan view to have a gentler curved shape, and after the convex portion is modified into a concave portion, the curved shape thereof may have a steeper slope e.g., with the number of trimming process increases.

However, if the slope approaches a specific reference slope, the photoresist pattern may be replaced with a new photoresist pattern, and the new photoresist pattern may have a shape similar to that of the previous one, e.g., the initially formed fourth and/or fifth photoresist patterns.

For example, the fifth sacrificial patterns 129 formed by an etching process using the photoresist patterns having the above described shapes may include edge portions having a shape corresponding to those of the photoresist patterns, and the pads formed by replacement of the fifth sacrificial patterns 129 may also have the same or a similar shape.

Accordingly, edge portions of the pads may have a curved shape with a slope of a given degree or less, and thus the fourth contact plugs 429 may be well-aligned to contact the upper surfaces of the respective pads, and may not contact other pads of different levels.

Figure 37:
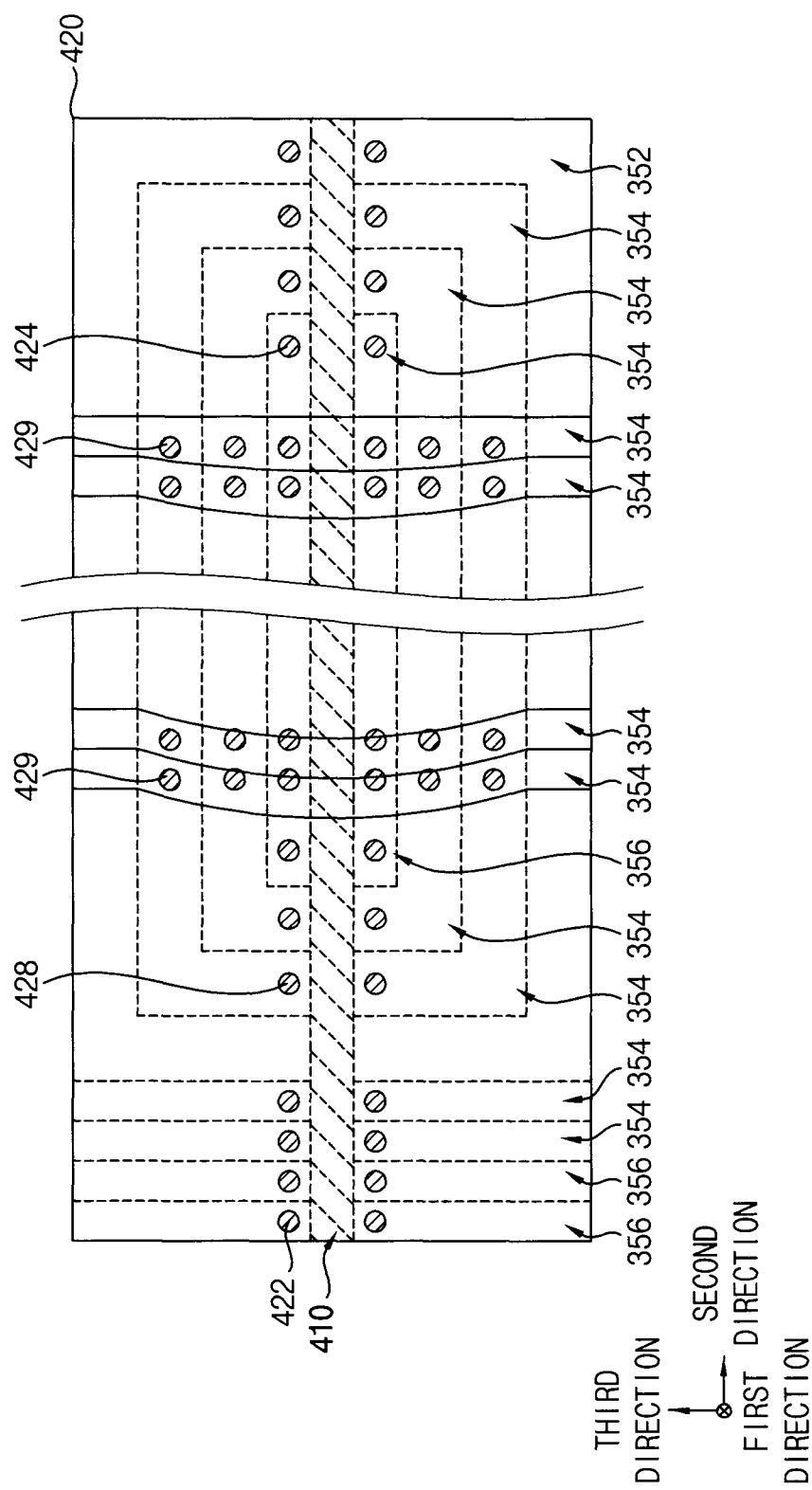
FIG. 37 is a plan view illustrating a vertical memory device in accordance with some example embodiments.

FIG. 37 is a plan view illustrating a vertical memory device in accordance with Comparative Example.

Referring to FIG. 37, a photoresist pattern covering an underlying staircase structure, e.g., the second sacrificial patterns 124 and the fourth sacrificial patterns 128 may be formed such that an edge portion in the second direction may have a linear shape in the third direction.

Accordingly, by repeatedly performing a trimming process on the photoresist pattern, a slope of a curved shape of a concave portion at the edge portion of the photoresist pattern may be gradually increase, and edge portions of some of the pads formed by replacement of sacrificial patterns, which may be formed using the photoresist pattern as an etching mask, may have a curved shape with a considerably large slope.

As a result, some of the fourth contact plugs 429 may contact not only corresponding ones of the pads of the desired levels, but also may partially contact other pads of different levels, and thus electrical shorts may occur.

As described above, although the present invention has been described with reference to example embodiments, those skilled in the art will readily appreciate that many modifications are possible in the example embodiments without materially departing from the novel teachings and advantages of the present inventive concept.

What is claimed is:

1. A vertical memory device, comprising:
a substrate including a first region including a cell array formed thereon and a second region surrounding the first region, the second region including a stair structure formed thereon;
gate electrodes stacked on the substrate to be spaced apart from each other in a first direction vertical to an upper surface of the substrate, each of the gate electrodes extending in a second direction parallel to the upper surface of the substrate and including a pad at an end portion thereof in the second direction;
a channel extending through the gate electrodes in the first direction on the first region of the substrate; and
contact plugs formed on the second region, the contact plugs extending in the first direction to contact the pads of the gate electrodes, respectively,
wherein a first pad of the pads, in a plan view, has a convex edge portion that is convex in a direction away from the first region of the substrate, and a second pad disposed on the first pad, in a plan view, has a concave edge portion that is concave in a direction toward the first region of the substrate.

2. The vertical memory device of claim 1, wherein a third pad disposed on the first pad among the pads, in a plan view, has a convex edge portion that is convex in the direction away from the first region of the substrate.

3. The vertical memory device of claim 2, wherein the third pad is disposed between the first pad and the second pad.

4. The vertical memory device of claim 2, wherein a boundary of the edge portion of the first pad has a first curved shape that is convex in a plan view, a boundary of the edge portion of the third pad has a second curved shape that is convex in a plan view, and the second curved shape has a lesser curvature than that of the first curved shape.

5. The vertical memory device of claim 4, wherein a fourth pad disposed between the second pad and the first pad, in a plan view, has a concave edge portion that is concave in the direction toward the first region of the substrate.

6. The vertical memory device of claim 5, wherein the fourth pad is disposed on the first pad.

7. The vertical memory device of claim 5, wherein a boundary of the edge portion of the second pad has a third curved shape that is concave in a plan view, a boundary of the edge portion of the fourth pad has a fourth curved shape that is concave in a plan view, and the fourth curved shape has a lesser curvature than that of the third curved shape.

8. The vertical memory device of claim 7, wherein a fifth pad disposed between the first and second pads among the pads, in a plan view, has an edge portion having a linear shape extending in a third direction parallel to the upper surface of the substrate and orthogonal to the second direction.

9. The vertical memory device of claim 1, wherein a boundary of the edge portion of the first pad has a first curved shape that is convex in a plan view, and
wherein a third pad among the pads has an edge portion including the same curvature as the first curved shape, and is formed at a different level from that of the first pad.

10. The vertical memory device of claim 9, wherein a fourth pad among the pads has an edge portion including the same curvature as the first curved shape, and is formed at a different level from that of the first pad, and
wherein the first, third and fourth pads are stacked in a third direction parallel to the upper surface of the substrate and orthogonal to the second direction to form a stair structure.

11. The vertical memory device of claim 1, wherein a boundary of the edge portion of the second pad has a first curved shape that is concave in a plan view, and
wherein a third pad among the pads has an edge portion including the same curvature as the first curved shape, and is formed at a different level from that of the second pad.

12. The vertical memory device of claim 11, wherein a fourth pad among the pads has an edge portion including the same curvature as the first curved shape, and is formed at a different level from that of the second pad, and
wherein the second, third and fourth pads are stacked in a first direction perpendicularly to the upper surface of the substrate and arranged in a third direction parallel to the upper surface of the substrate and intersecting with the second direction at a right angle to form a stair structure.

13. The vertical memory device of claim 1, wherein a plurality of first pads having convex edge portions and a plurality of second pads having concave edge portions are alternately stacked in the first direction.

14. A vertical memory device, comprising:
a substrate including a first region which is a cell array region and a second region surrounding the first region;
gate electrodes stacked on the substrate to be spaced apart from each other in a first direction vertical to an upper surface of the substrate, each of the gate electrodes extending in a second direction parallel to the upper surface of the substrate and including a pad at an end portion thereof in the second direction;
a channel extending through the gate electrodes in the first direction on the first region of the substrate; and
contact plugs extending in the first direction on the second region of the substrate to contact the pads of the gate electrodes respectively,
wherein edge portions in the second direction of first pads among the pads, in a plan view, are convex in a direction away from the first region, and the first pads are arranged in a third direction parallel to the upper surface of the substrate and orthogonal to the second direction; and wherein edge portions of second pads among the pads, in plan view, are concave in a direction toward the first region, and the second pads are arranged in the third direction, wherein the second pads are disposed on the first pads.

15. The vertical memory device of claim 14, wherein a boundary of the edge portions of the second pads, in a plan view, has a first curved shape that is concave in the direction toward the first region, and
wherein a boundary of edge portions in the second direction of third pads among the pads, in a plan view, has a second curved shape that is concave in the direction toward the first region, the third pads being disposed between the first pads and the second pads, and arranged in the third direction, and
wherein a curvature of the second curved shape is less than a curvature of the first curved shape.

16. The vertical memory device of claim 14, wherein a boundary of the edge portions of the first pads, in a plan view, has a first curved shape that is convex in the direction away from the first region, and
wherein a boundary of edge portions in the second direction of second pads among the pads, in a plan view, has a second curved shape that is convex in the direction away from the first region, the second pads being disposed on the first pads and arranged in the third direction, and
wherein a curvature of the first curved shape is greater than a curvature of the second curved shape.

17. A vertical memory device, comprising:
a substrate including a first region which is a cell array region and a second region surrounding the first region;
gate electrodes stacked on the substrate to be spaced apart from each other in a first direction vertical to an upper surface of the substrate, each of the gate electrodes extending in a second direction parallel to the upper surface of the substrate and including a pad being at an end portion thereof in the second direction;
a channel extending through the gate electrodes in the first direction on the first region of the substrate; and
contact plugs extending in the first direction on the second region of the substrate to contact the pads of the gate electrodes respectively,
wherein a boundary of edge portions in the second direction of first pads among the pads, in a plan view, has a first curved shape that is convex in a direction away from the first region of the substrate, the first pads being arranged in a third direction parallel to the upper surface of the substrate and orthogonal to the second direction,
wherein a boundary of edge portions in the second direction of second pads among the pads, in a plan view, has a second curved shape that is convex in the direction away from the first region of the substrate, the second pads being formed on the first pads and arranged in the third direction, and
wherein a curvature of the second curved shape is less than a curvature of the first curved shape.

18. The vertical memory device of claim 17, wherein a boundary of edge portions in the second direction of third pads among the pads, in a plan view, has a third curved shape that is concave in a direction toward the first region, the third pads being disposed on the second pads and arranged in the third direction.

* * * * *